(12) United States Patent
Sugizaki

(10) Patent No.: US 8,080,830 B2
(45) Date of Patent: Dec. 20, 2011

(54) SEMICONDUCTOR DEVICE AND METHOD OF DRIVING THE SAME

(75) Inventor: Taro Sugizaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 538 days.

(21) Appl. No.: 11/802,141

(22) Filed: May 21, 2007

(65) Prior Publication Data

US 2007/0295987 A1 Dec. 27, 2007

(30) Foreign Application Priority Data

Jun. 22, 2006 (JP) .................................. 2006-172277
Oct. 16, 2006 (JP) .................................. 2006-280960

(51) Int. Cl.
*H01L 29/74* (2006.01)
(52) U.S. Cl. .......... 257/157; 257/E27.052; 257/E29.036
(58) Field of Classification Search .................. 257/157, 257/E27.052, E29.036
See application file for complete search history.

(56) References Cited

U.S. PATENT DOCUMENTS

| | | | | |
|---|---|---|---|---|
| 5,621,229 A | * | 4/1997 | Huang | 257/212 |
| 6,118,141 A | * | 9/2000 | Xu et al. | 257/133 |
| 6,462,359 B1 | | 10/2002 | Nemati et al. | |
| 6,888,176 B1 | * | 5/2005 | Horch et al. | 257/107 |
| 6,911,680 B1 | * | 6/2005 | Horch et al. | 257/162 |
| 7,381,999 B1 | * | 6/2008 | Yang | 257/133 |

OTHER PUBLICATIONS

Farid Nemati et al., "Fully Planar 0.562 βm² T-RAM CELL in a 130nm SOI CMOS Logic Technology for High-Density High-Performance SRAMs", 2004 IEEE IEDM Tech., pp. 273, California 2004.
Farid Nemati et al., "A Novel Thyristor-based SRAM Cell (T-RAM) for high-Speed, Low-Voltage, Giga-scale Memories", 1999 IEEE IEDM Tech., pp. 283, Stanford, California, 1999.
Farid Nemati et al., "A Novel High Density, Low Voltage SRAM: Cell with a Vertical NDR Device", 1998 IEEE, VLSI Technology Tech. Dig., pp. 66, Stanford, California, 1998.

* cited by examiner

*Primary Examiner* — Eugene Lee
(74) *Attorney, Agent, or Firm* — Rader, Fishman & Grauer PLLC

(57) ABSTRACT

A semiconductor device includes: a bulk semiconductor substrate; a thyristor formed in the bulk semiconductor substrate; a gate electrode formed at the third region; and a well region. The thyristor included a first region of a first conduction type, a second region of a second conduction type opposite to the first conduction type, a third region of the first conduction type, and a fourth region of the second conduction type, junctioned in order. The well region of the second conduction type is formed in the bulk semiconductor substrate, the third region is formed in the well region. A first voltage is impressed on the first region side of the thyristor, a second voltage higher than the first voltage is impressed on the fourth region side of the thyristor, and a voltage higher than or equal to the first voltage is impressed on the well region.

17 Claims, 19 Drawing Sheets

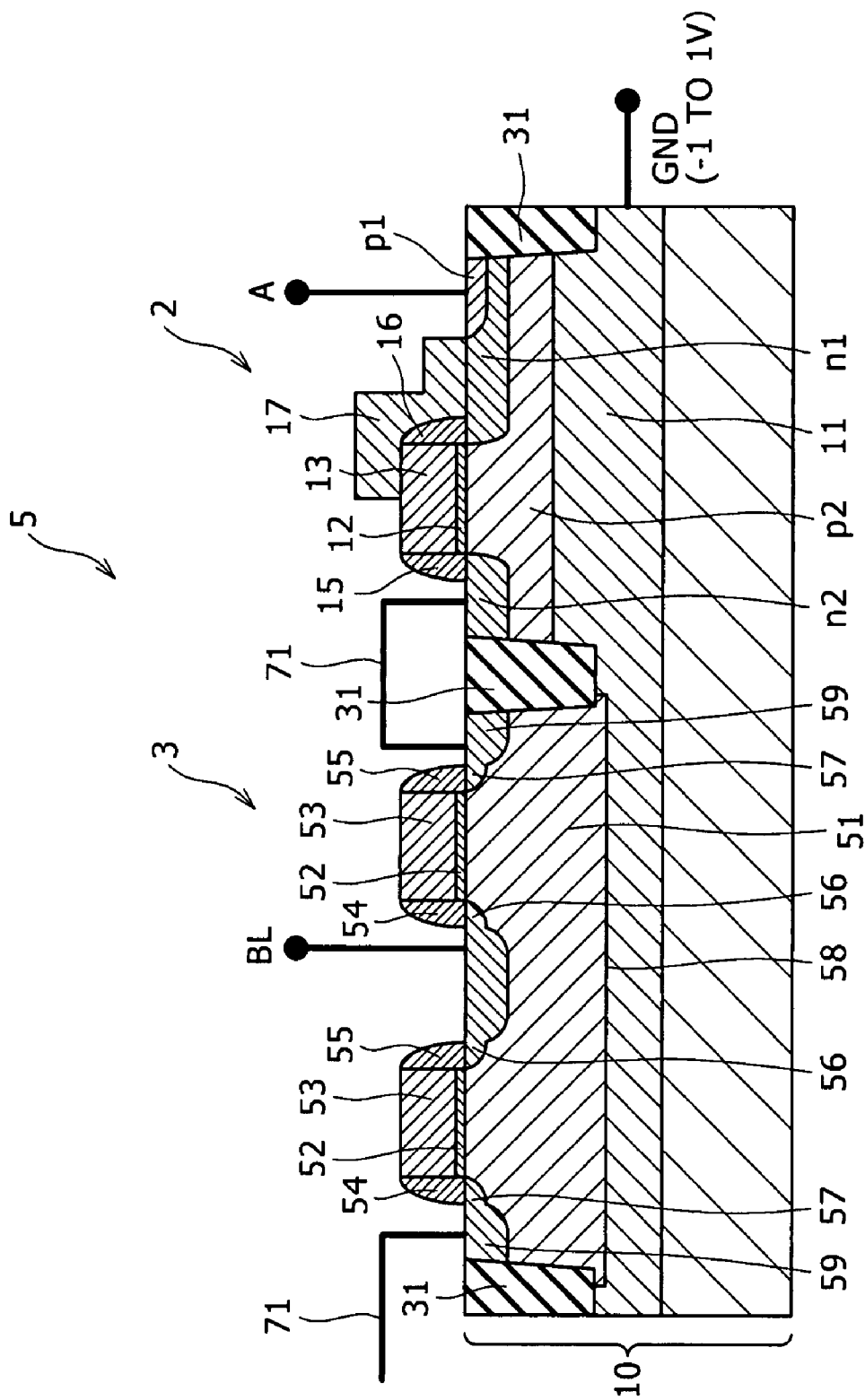

ON STATE

OFF STATE

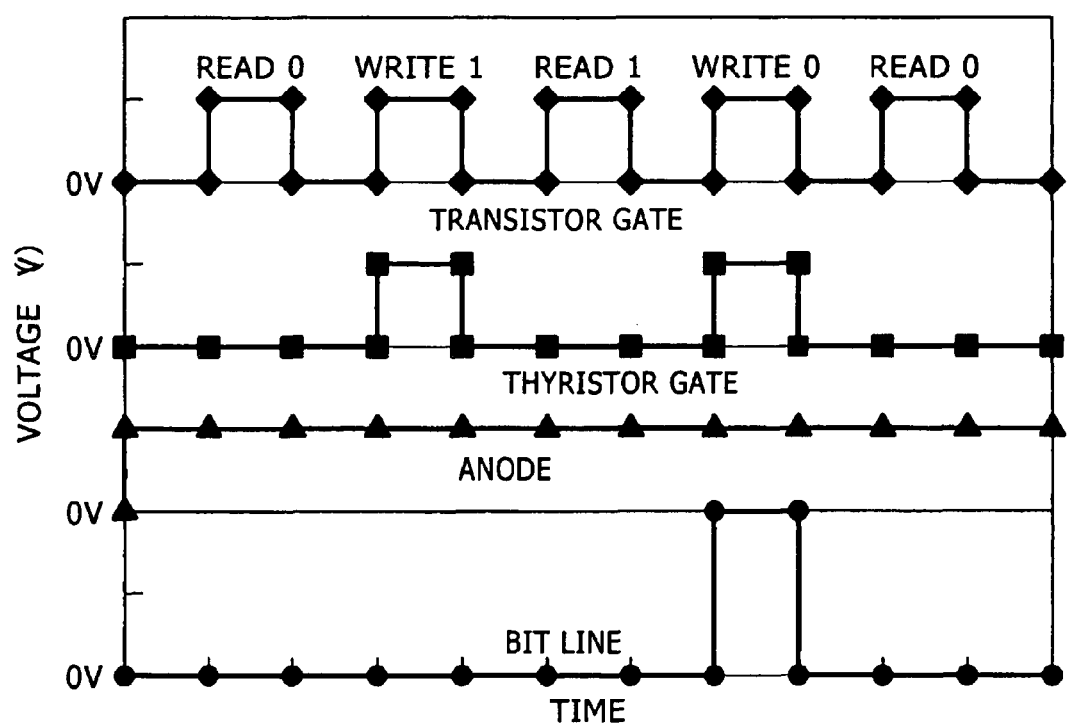

SEMICONDUCTOR DEVICE AND METHOD OF DRIVING THE SAME

CROSS REFERENCES TO RELATED APPLICATIONS

The present invention contains subject matter related to Japan Patent Application JP 2006-172277 filed with the Japan Patent Office on Jun. 22, 2006, and Japan Patent Application JP 2006-280960 filed with the Japan Patent Office on Oct. 16, 2006 the entire contents of which being incorporated herein by reference.

BACKGROUND OF THE INVENTION

1. Field of the Invention

The present invention relates to a semiconductor device enhanced in the speed of switching from an ON state to an OFF state, and to a method of driving the same.

2. Description of the Related Art

A memory (especially for application to SRAM) in which thyristors are used, the turn-on/turn-off characteristics of the thyristors are controlled by gate electrodes realized on the thyristors, and the thyristors are connected in series with access transistors, has been proposed (the memory will hereinafter be referred to as T-RAM). The T-RAM performs memory actions with the OFF region of the thyristor as "0" and the ON region as "1".

The thyristor has a basic structure in which a p-type region p1, an n-type region n1, a p-type region p2, and an n-type region n2 are junctioned in order, and in which n-type silicon and p-type silicon are used in a total of four layers. This basic structure will hereinafter be expressed as "p1/n1/p2/n2". Two kinds of configurations have been proposed by T-RAM. One has the p1/n1/p2/n2 structure vertically built up on a silicon substrate, and the other has the p1/n1/p2/n2 structure arranged laterally in a silicon layer by using a SOI substrate. In either of the configurations, a gate electrode with a MOS structure is provided over p2 of the p1/n1/p2/n2, thereby permitting high-speed operation.

For example, as shown in FIG. 18A, the semiconductor device with the thyristor configuration has a first p-type region p1, a first n-type region n1, a second p-type region p2, and a second n-type region n2 which are Functioned in order, thereby forming the p1/n1/p2/n2 structure. An anode A is connected to the first p-type region p1 on one end side, and a cathode K is connected to the second n-type region n2 on the other end side. Further, a gate electrode G is arranged at the second p-type region p2 disposed on the inside. Such a thyristor has either of a configuration in which the p1/n1/p2/n2 structure is vertically arranged in a surface layer of a silicon substrate and a configuration in which the p1/n1/p2/n2 structure is laterally arranged by use of a SOI substrate.

In the semiconductor device with the thyristor configuration, when a forward bias is impressed between the anode A and the cathode K as shown in FIG. 18B, holes are supplied from the p-type region p1 connected to the anode A into the n-type region n1, and electrons are supplied from the n-type region n2 connected to the cathode K into the p-type region p2. Then, the holes and electrons are recombined in a junction portion between the n-type region n1 and the p-type region p2, whereby a current is permitted to flow, and an ON state is obtained.

On the other hand, when a reverse bias is impressed between the anode A and the cathode K as shown in FIG. 18C, an OFF state is obtained; however, it takes a time of a few microseconds (ms) to obtain a substantial OFF state. In other words, once the ON state is attained, spontaneous switching from the ON state to the OFF state would not occur when a reverse bias is simply impressed between the anode A and the cathode K. It is only after the current is reduced to below a holding current or the power source is turned off that the excess carriers flowing in the n-type region n1 and the p-type region p2 can entirely be swept out of these regions or be recombined.

Therefore, while a negative voltage is impressed on the anode A and a positive voltage is impressed on the cathode K to establish a reverse-biased condition at the time of switching from the ON state to the OFF state, if this operation is conducted alone, it would take a few microseconds (ms) to achieve the intended switching. In practice, therefore, a voltage is impressed on the gate electrode (thyristor gate) provided at the p-type region p2 as shown in a pulse timing chart in FIG. 19, whereby an electric field is generated in the p-type region p2 to forcibly discharge the electrons present as the excess carriers, thereby achieving a faster switching to a substantial OFF state. In this case, a high-speed operation on the order of a few nanoseconds (ns) is achieved.

In addition, there is a configuration called GTO (Gate Turn off Thyristor) in which a gate electrode is in direct contact with the p-type region p2. The configuration in which a MOS electrode is provided is a modified example of the GTO, and the role of the electrode is the same as above.

Meanwhile, at the time of turning-off operation, i.e., "write 0" operation in the case of a cell array, a voltage for a reverse bias condition is simultaneously applied from the cathodes to the cells on the same bit line as the selected bit, but no voltage is impressed on the thyristor gates of non-selected bits. Therefore, the turn-off speed of the non-selected bits is so slow that only the selected bit can be turned OFF.

In the case where a bulk silicon wafer is used, however, the p-type region p2 extends deep in the depth direction of the substrate, so that the bias impressed through the gate electrode ranges to only part of the p2 layer and, therefore, the effect of the impressing of the bias through the gate electrode would be limited.

In the next place, the relationship of the voltage ($V_{AK}$) between the anode A and the cathode K in the semiconductor device having the thyristor configuration with the current (I) flowing in the semiconductor device will be described below, referring to FIG. 20.

As shown in FIG. 20, as a positive voltage is impressed on the anode A, the pn junction between the n-type region n1 and the p-type region p2 is forward-biased when the voltage $V_{AK}$ reaches a critical voltage $V_{FB}$, whereon the voltage $V_{AK}$ is lowered and a current of not less than the holding current $I_H$ begins to flow. It is to be noted here, however, that only a switching current $I_S$ lower than the holding current $I_H$ flows until the voltage $V_{AK}$ reaches or exceeds the critical voltage $V_{FB}$, and that a current greater than the holding current $I_H$ begins to flow when the voltage $V_{AK}$ has exceeded the critical voltage $V_{FB}$.

A configuration with a MOS structure in which a gate electrode is disposed over the p-type region p2 through an insulating film therebetween so as to fasten the switching operation as above-mentioned has been proposed (refer to, for example, U.S. Pat. No. 6,462,359 (B1), Non-patent Document Farid Nemati and James D. Plummer, "A Novel High Density, Low Voltage SRAM Cell with a Vertical NDR Device", 1998 IEEE, VLSI Technology Tech. Dig., p. 66, 19981, Non-patent Document Farid Nemati and James D. Plummer, "A Novel Thyristor-based SRAM Cell (T-RAM) for High-Speed, Low-Voltage, Giga-scale Memories", 1999 IEEE IEDM Tech., p. 283, 1999, and Non-patent Document Farid Nemati, Hyn-Jin Cho, Scott Robins, Rajesh Gupta, Marc Tarabbia, Kevin J. Yang, Dennis Hayes, Vasudevan Gopalakrishnan, "Fully Planar 0.562 μm2 T-RAM Cell in a 130 nm SOI CMOS Logic Technology for High-Density High-Performance SRAMs", 2004 IEEE IEDM Tech., p. 273, 2004).

SUMMARY OF THE INVENTION

As has been mentioned above, where a bulk silicon wafer is used, the speed of switching from the ON state to the OFF state is low, and the effect of the bias applied through the gate electrode is low.

Thus, there is a need for an enhanced effect of a bias applied through the gate electrode and for an enhanced speed of switching from the ON state to the OFF state.

According to an embodiment of the present invention, there is provided a semiconductor device including: a bulk semiconductor substrate; a thyristor formed in the bulk semiconductor substrate; a gate electrode formed at the third region; and a well region. The thyristor includes a first region of a first conduction type, a second region of a second conduction type opposite to the first conduction type, a third region of the first conduction type, and a fourth region of the second conduction type, junctioned in order. The well region of the second conduction type is formed in the bulk semiconductor substrate, the third region is formed in the well region. A first voltage is impressed on the first region side of the thyristor, a second voltage higher than the first voltage is impressed on the fourth region side of the thyristor, and a voltage higher than or equal to the first voltage is impressed on the well region.

In the semiconductor device as above, a first voltage is impressed on the first region side of the thyristor, a second voltage higher than the first voltage is impressed on the fourth region side of the thyristor, and a voltage higher than or equal to the first voltage is impressed on the well region, so that excess carriers (electrons) in the third region are swept out into the second conduction type well region. Where a SOI substrate such that an electric field is sufficiently impressed through the gate electrode according to the related art is used, the excess carriers (electrons) in the third region can be swiftly drawn out by applying a gate bias. However, in the case of a bulk semiconductor substrate, the effect of the gate bias is low. Therefore, there is a need to wait for the electrons in the third region to be consumed through recombination, so that the time taken for turning-off is determined by the recombination time. In view of this, the above-mentioned bias voltage is impressed on the well region to forcibly sweep out the electrons present in the third region to the well region side, the erasing time is shortened.

According to another embodiment of the present invention, there is provided a method of driving a semiconductor device including: a bulk semiconductor substrate; a thyristor formed in the bulk semiconductor substrate, a gate electrode formed at the third region; and a well region. The thyristor includes a first region of a first conduction type, a second region of a second conduction type opposite to the first conduction type, a third region of the first conduction type, and a fourth region of the second conduction type, Functioned in order. The well region of the second conduction type is formed in the bulk semiconductor substrate, the third region is formed in the well region. The method including the steps of: impressing a first voltage on the first region side; impressing on the fourth region side a second voltage higher than the first voltage; and impressing on the well region a voltage higher than or equal to the first voltage.

In the method of driving a semiconductor device as above, a first voltage is impressed on the first region side, a second voltage higher than the first voltage is impressed on the fourth region side, and a voltage higher than or equal to the first voltage is impressed on the well region, so that excess carriers (electrons) in the third region are swept out into the second conduction type well region. Where a SOI substrate such that an electric field is sufficiently impressed through the gate electrode according to the related art is used, the excess carriers (electrons) in the third region can be swiftly drawn out by applying a gate bias. However, in the case of a bulk semiconductor substrate, the effect of the gate bias is low. Therefore, there is a need to wait for the electrons in the third region to be consumed through recombination, so that the time taken for turning-off is determined by the recombination time. In view of this, the above-mentioned bias voltage is impressed on the well region to forcibly sweep out the electrons present in the third region to the well region side, the erasing time is shortened.

According to the semiconductor device, the excess carriers (electrons) in the third region are forcibly swept out to the well region side without dependence on the electric field applied from the gate electrode, so that the erasing time can be shortened, and a fast turn-OFF operation can be realized. This ensures that a high device speed comparable to or higher than that in a configuration using a SOI substrate can be achieved, notwithstanding the use of a bulk semiconductor substrate.

According to the method of driving a semiconductor device, the excess carriers (electrons) in the third region are forcibly swept out to the well region side without dependence on the electric field applied from the gate electrode, so that the erasing time can be shortened, and a fast turn-OFF operation can be realized. This ensures that a high device speed comparable to or higher than that in a configuration using a SOI substrate can be achieved, notwithstanding the use of a bulk semiconductor substrate.

BRIEF DESCRIPTION OF THE DRAWINGS

FIG. 17 is a schematic configuration sectional view showing a modified example of the first embodiment of the semiconductor device in the present invention;

FIG. 19 is a pulse timing chart of the semiconductor device with the thyristor configuration using a SOI substrate according to the related art.

DETAILED DESCRIPTION OF THE PREFERRED EMBODIMENTS

Embodiments of the semiconductor device and the method of driving the same in the present invention will be described below, referring to the schematic configuration sectional view shown in FIG. 1.

Figure 1:
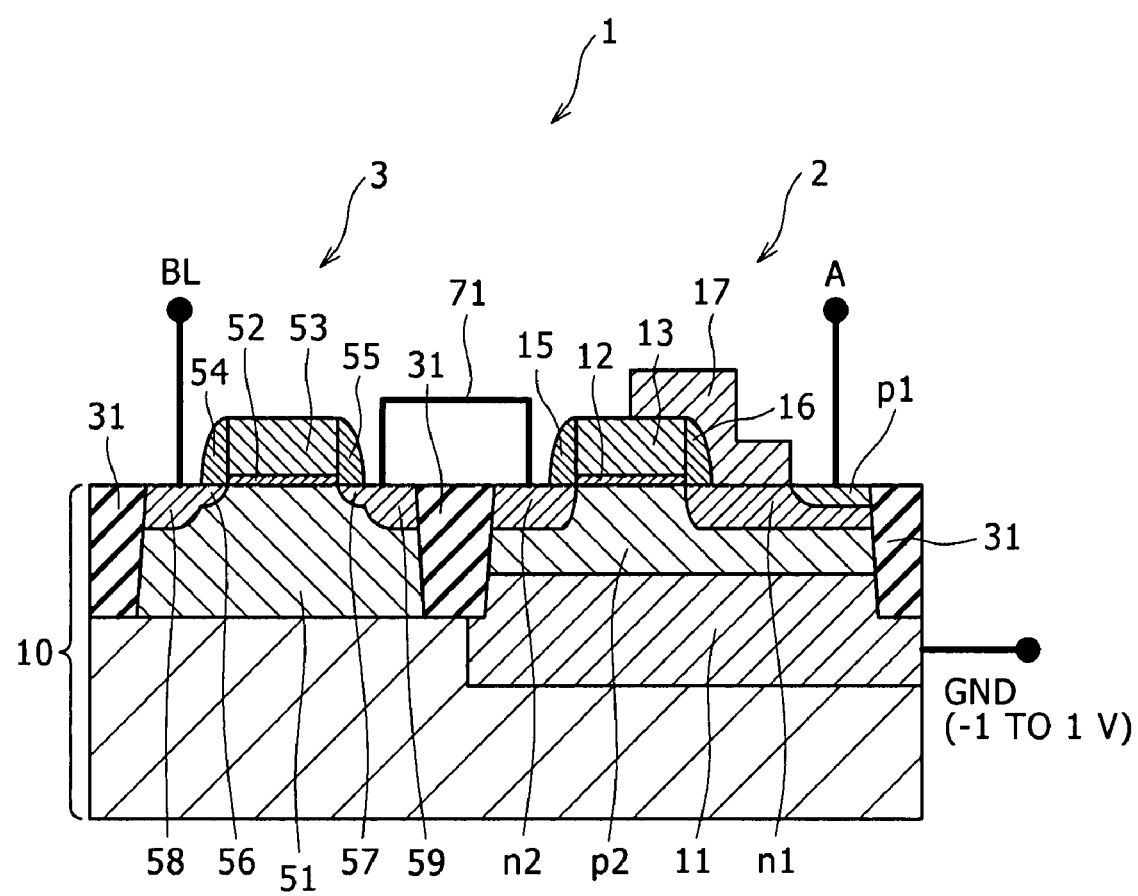
FIG. 1 is a schematic configuration sectional view showing one embodiment of the semiconductor device in the present invention.

As shown in FIG. 1, the semiconductor device 1 has a thyristor 2 including a first region (hereinafter referred to as the first p-type region) p1 of a first conduction type (p type hereinafter), and a second region (hereinafter referred to as the first n-type region) n1 of a second conduction type (n type hereinafter) opposite to the first conduction type. The thyristor 2 further includes a third region (hereinafter referred to as the second p-type region) p2 of the first conduction type (p type), and a fourth region (hereinafter referred to as the second n-type region) n2 of the second conduction type (n type). The p1, n1, p2, and n2 are junctioned in order.

A bulk semiconductor substrate 10 is provided with a device forming region partitioned by device isolation regions 31, and the bulk semiconductor substrate 10 provided with a thyristor is formed with a well region 11 of the second conduction type (n type). An upper layer of the well region 11 is formed in a region of the first conduction type (p type), and this region serves as the second p-type region p2 of the thyristor. As the bulk semiconductor substrate 10, for example, a bulk silicon substrate is used. The second p-type region p2 is formed, for example, by introducing boron (B) as a p-type dopant in a dopant concentration of about $5 \times 10^{18}$ cm$^{-3}$. The dopant concentration in the second p-type region p2 is desirably about $1 \times 10^{18}$ to $1 \times 10^{19}$ cm$^{-3}$, and should basically be lower than the dopant concentration in the first n-type region n1 of the second conduction type (n type) which will be described later. Besides, other than boron (B), a p-type impurity such as indium (In) may be used as the p-type dopant.

A gate electrode 13 is formed over the second p-type region p2 through a gate insulating film 12 therebetween. A hard mask (not shown) may be formed over the gate electrode 13. The gate insulating film 12 is composed, for example, of a silicon oxide (SiO$_2$) film, in a thickness of about 1 to 10 nm. The material forming the gate insulating film 12 is not limited to silicon oxide (SiO$_2$). Examples of the material which can be used include not only silicon oxynitride (SiON) but also gate insulating film materials applicable to ordinary CMOS transistors, such as hafnium oxide (HfO$_2$), hafnium oxynitride (HfON), aluminum oxide (Al$_2$O$_3$), hafnium silicate (HfSiO), hafnium silicate nitride (HfSiON), and lanthanum oxide (La$_2$O$_3$).

The gate electrode 13 is usually formed of polycrystalline silicon. Or, the gate electrode may be a metal gate electrode, or may be formed of silicon-germanium (SiGe) or the like. The hard mask used in forming the gate electrode 13 may be left on the gate electrode 13. The hard mask is composed, for example, of a silicon oxide (SiO$_2$) film, a silicon nitride (Si$_3$N$_4$) film or the like.

Side walls 15 and 16 are formed on side walls of the gate electrode 13. The side walls 15 and 16 are formed of silicon oxide (SiO$_2$) or silicon nitride (Si$_3$N$_4$) or a laminate film of them. Further, a salicide block 17 used in performing a salicide process on the anode side and the cathode side may be formed in the area ranging from the area over the second region n1 to the area over the gate electrode 13.

The first n-type region n1 of the second conduction type (n type) in junction to the second p-type region p2 is formed in the bulk semiconductor substrate 10 on one side of the gate electrode 13. The first n-type region n1 is formed, for example, by introducing phosphor (P) as an n-type dopant so as to obtain a dopant concentration of, for example, $1.5 \times 10^{19}$ cm$^{-3}$. The dopant concentration is desirably about $1 \times 10^{18}$ to $1 \times 10^{21}$ cm$^{-3}$, and should be higher than the dopant concentration in the second p-type region p2. Besides, phosphorus may be replaced by other n-type dopant such as arsenic and antimony.

The second n-type region n2 of the second conduction type (n type) in junction to the second p-type region p2 is formed in the bulk semiconductor substrate 10 on the other side of the gate electrode 13. The second n-type region n2 is formed, for example, by introducing arsenic (As) as an n-type dopant so as to obtain a dopant concentration of, for example, $1 \times 10^{19}$ cm$^{-3}$. The dopant concentration is desirably about $1 \times 10^{18}$ to $1 \times 10^{21}$ cm$^{-3}$, and should be higher than the dopant concentration in the second p-type region p2. Besides, arsenic may be replaced by other n-type dopant such as phosphorus and antimony.

Further, the first p-type region p1 of the first conduction type (p type) is formed in an upper part of the first n-type region n1. The first p-type region p1 has, for example, a boron (B) concentration of $1 \times 10^{20}$ cm$^{-3}$. This dopant (boron) concentration is desirably about $1 \times 10^{18}$ to $1 \times 10^{21}$ cm$^{-3}$.

Furthermore, an anode A (power source voltage VDD) is connected to the first p-type region p1, and a cathode K is connected to the second n-type region n2. In addition, though not shown, a silicide (titanium silicide, cobalt silicide, nickel silicide or the like) may be formed over the first p-type region p1, the second n-type region n2, and the gate electrode 13.

In the semiconductor device 1 as above, a first voltage is applied to the first p-type region p1 side of the thyristor 2, a second voltage higher than or equal to the first voltage is applied to the second n-type region n2 side, and a voltage higher than the first voltage is applied to the well region 11.

The voltage applied to the well region 11 is not higher than the second voltage. For example, the well region 11 is connected to a ground GND (−1 to 1 V).

In the semiconductor device 1 as above, the first p-type region p1 may be stacked on the first n-type region by epitaxial growth, for example. In addition, the second n-type region n2 may be stacked on the second p-type region p2 by epitaxial growth, for example.

On the other hand, a first conduction type (p type) well region 51 is formed in a region of the bulk semiconductor substrate 10 in which to form a field effect transistor, and the field effect transistor 3 is formed. The field effect transistor 3 has a gate electrode 53 formed over the p-type well region 51 with a gate insulating film 52 therebetween, and side walls 54 and 55 are formed on both sides of the gate electrode 53. In addition, source/drain extension regions 56 and 57 are formed in the p-type well region 51 on the lower side of the side walls 54 and 55. Further, the p-type well region 51 on both sides of the gate electrode 53 is formed with a drain region 58 on one side and a source region 59 on the other side, through the extension regions 56 and 57, respectively, and the source region 59 is connected to the second n-type region n2 (cathode side) of the thyristor 2 through a wiring 71 (cathode K). In addition, the drain region 58 is connected to a bit line.

Now, as a first embodiment, a case where the well region 11 is set at a fixed potential will be described below, referring to FIG. 1 and a timing chart shown in FIG. 2.

Figure 2:
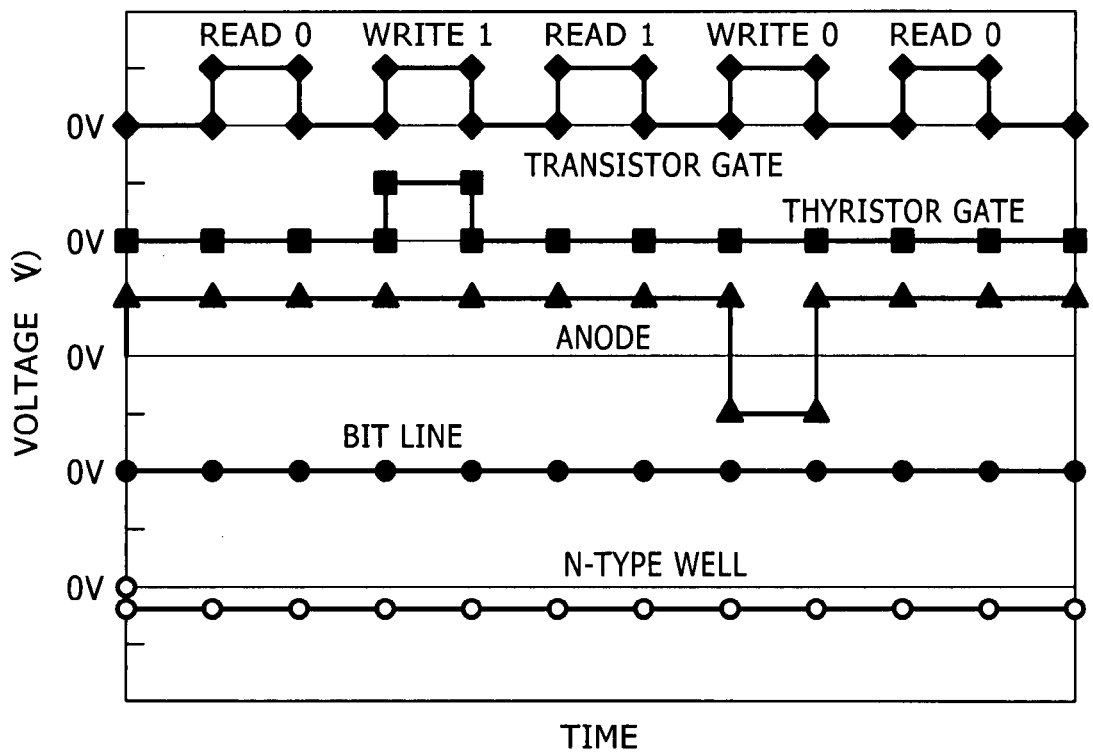
FIG. 2 is a pulse timing chart of first embodiment of the semiconductor device in the present invention.

As shown in FIGS. 1 and 2, a fixed potential of, for example, in the range of −1 to 1 V is constantly impressed on the well region 11. This potential is set to be not lower than an anode potential (potential on the anode A side) at a turn-OFF (write 0) time, and is desirably in the range of about 0 to −0.2 V. At the turn-OFF (write 0) time, the anode potential is lowered from a potential of about 0.4 to 2 V to a potential of about 0 to −2 V, to be lower than the cathode potential (potential on the cathode K side). The lowering in the anode potential is desirably about −1 to −1.5 V. In addition, simultaneously, for permitting excess carriers to escape easily from the cathode K side also, the potential at the gate of the field effect transistor 3 is raised, whereby the field effect transistor 3 is put into an ON state. This raising of potential is about 0.5 to 2 V, desirably about 0.6 to 1.5 V, so as to permit a channel in the field effect transistor 3 to be formed thoroughly.

Now, as a second embodiment, a case where the well region 11 is set at a variable potential will be described below, referring to FIG. 1 and a timing chart shown in FIG. 3.

Figure 3:
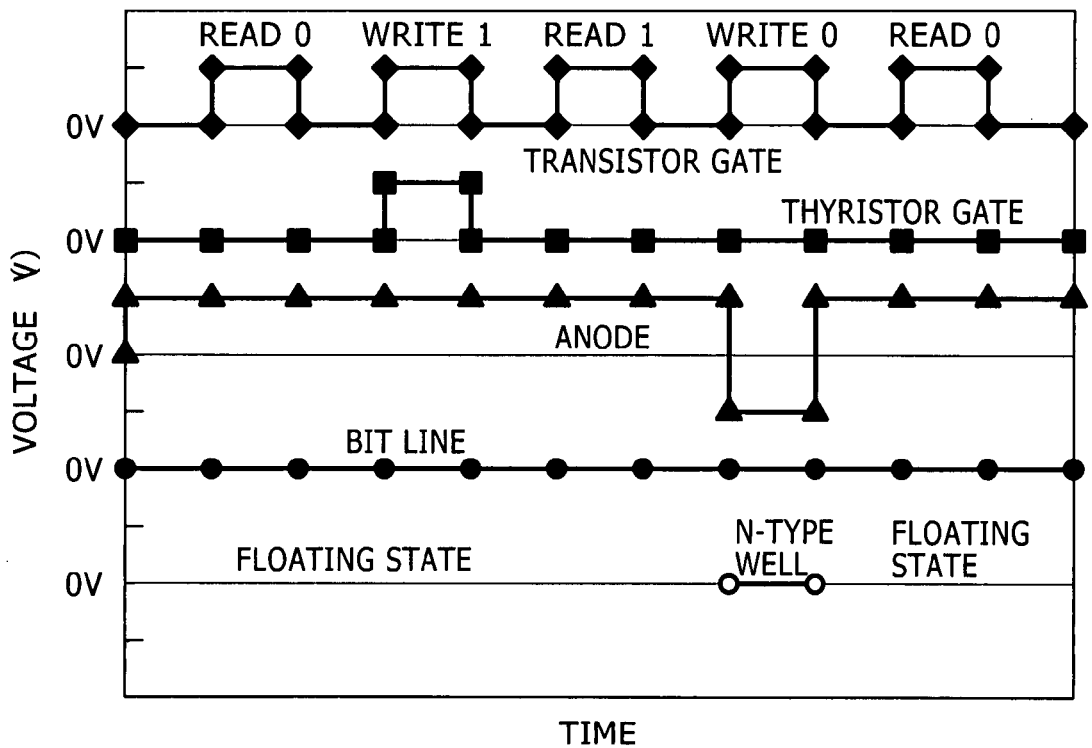
FIG. 3 is a pulse timing chart of second embodiment of the semiconductor device in the present invention.

As shown in FIGS. 1 and 3, a voltage of, for example, in the range of −1 to 1 V is impressed on the well region 11 at the time of a turn-OFF (write 0) operation only. This voltage is set to be not lower than an anode potential (potential on the anode A side) at a turn-OFF (write 0) time, and is desirably in the range of about 0 to −0.2 V. At the turn-OFF (write 0) time, the anode potential is lowered from a potential of about 0.4 to 2 V to a potential of about 0 to −2 V, to be lower than the cathode potential (potential on the cathode K side). The lowering in the anode potential is desirably about −1 to −1.5 V. In addition, simultaneously, for permitting excess carriers to escape easily from the cathode K side also, the potential at the gate of the field effect transistor 3 is raised, whereby the field effect transistor 3 is put into an ON state. This raising of potential is about 0.5 to 2 V, desirably about 0.6 to 1.5 V, so as to permit a channel in the field effect transistor 3 to be formed thoroughly.

By thus applying a voltage only at the turn-OFF (write 0) time and setting the well region 11 in a floating state at other times, it is possible to prevent a wasteful current from flowing into the well region 11.

Figure 4:
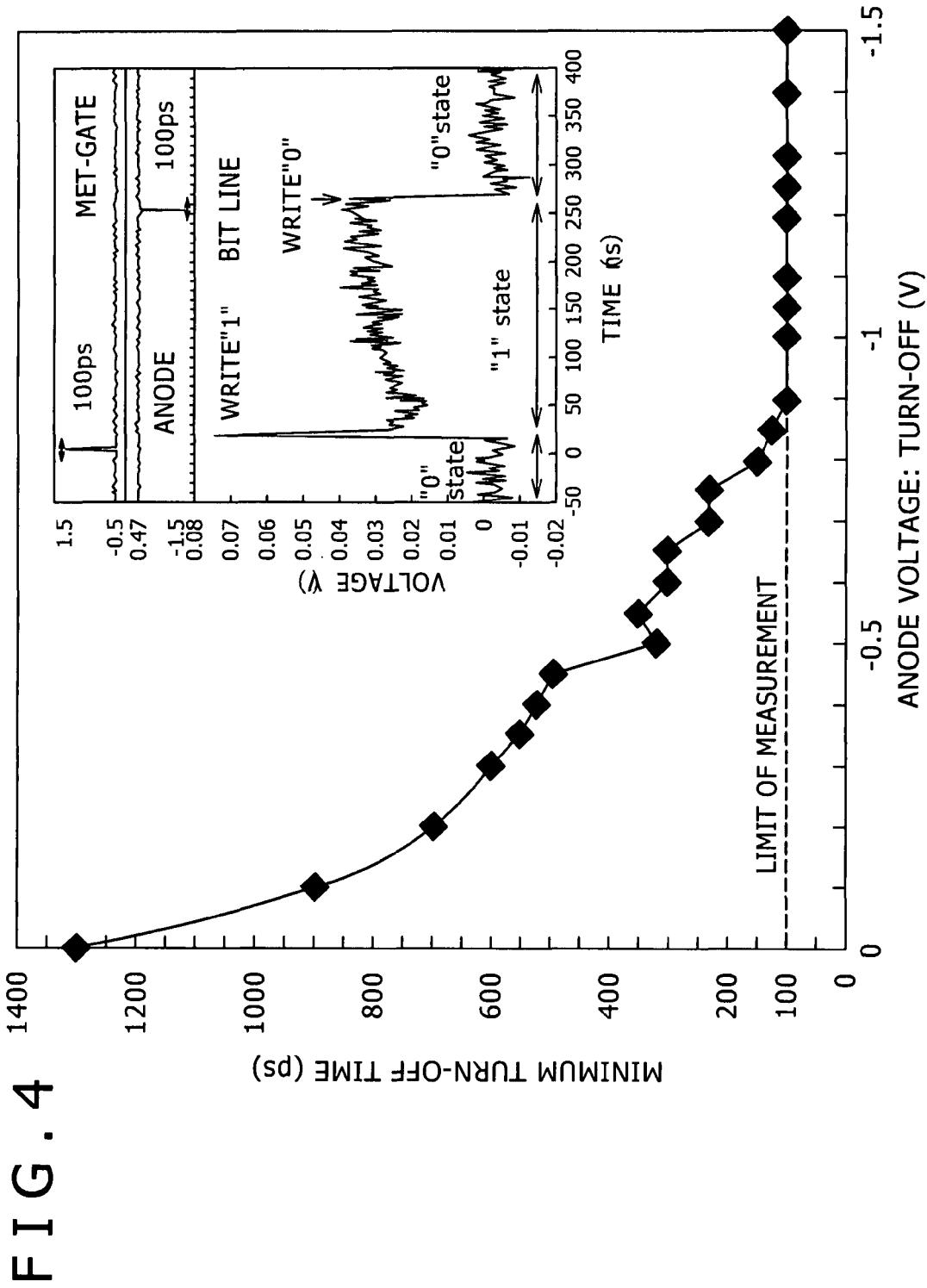
FIG. 4 is s diagram showing the turn-off time of the semiconductor device in one embodiment of the present invention.

In the semiconductor device 1 in one embodiment of the present invention, as shown in a diagram in FIG. 4 showing the relationship between minimum erasure time (ps) and anode voltage (V) at the erasure time, setting the anode voltage to −0.9 V or below results in that the minimum turn-off time is 100 ps or below.

Figure 5A:
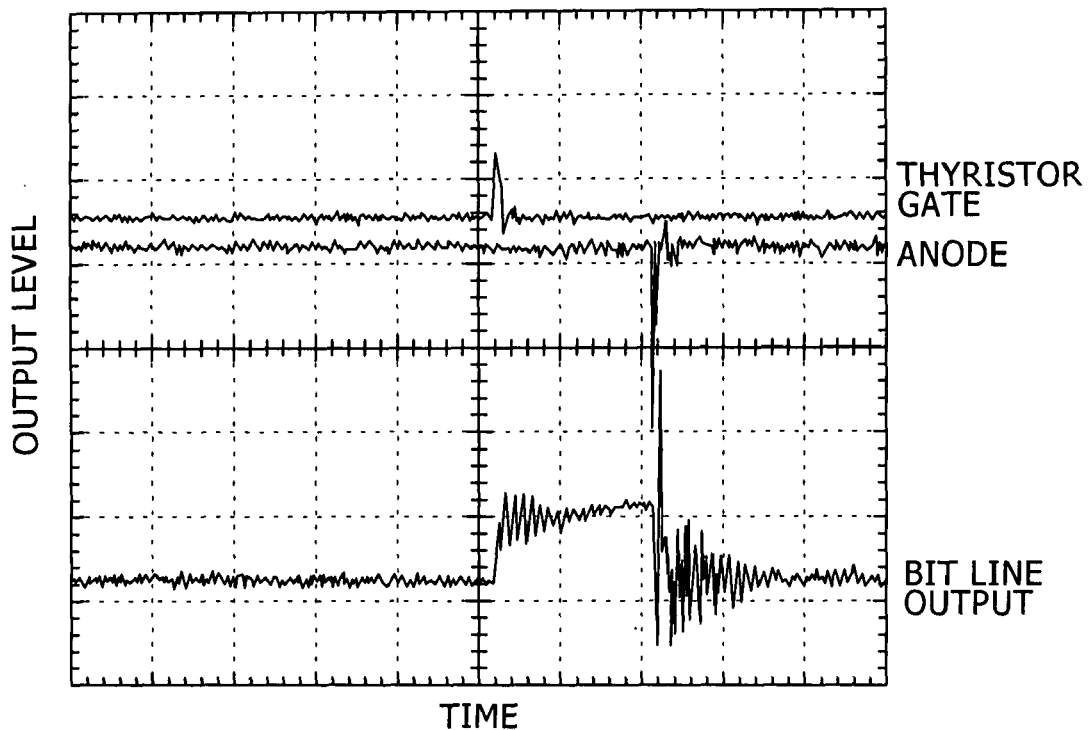
FIGS. 5A and 5B are timing charts showing a comparison between the operations of the semiconductor device in one embodiment of the present invention and a semiconductor device using a SOI substrate according to the related art.
Figure 5B:
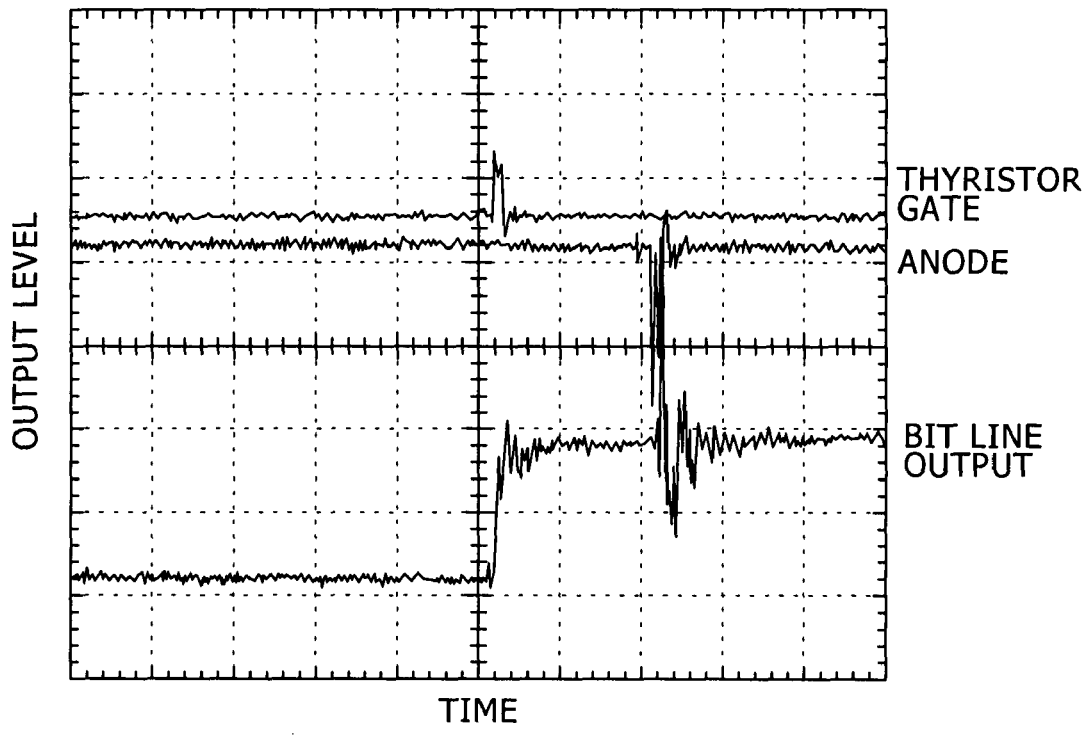

In addition, in the semiconductor device 1 in one embodiment of the present invention, as shown in a pulse timing chart in FIG. 5A, in the case where the channel region 11 is set to the ground GND, turning the thyristor gate (gate electrode 13) ON causes an output to the bit line, and application of a reverse bias to the anode for effecting an OFF operation turns OFF the bit line output. On the other hand, as shown in a pulse timing chart in FIG. 5B, in the case where the channel region 11 is set in an electrically floating state, turning the thyristor gate (gate electrode 13) ON causes an output to the bit line, and application of a reverse bias to the anode for effecting a turn-OFF operation does not turn OFF the bit line output.

Further, as shown in Table 1 below, in the semiconductor device 1 in one embodiment of the present invention, a turn-OFF time of 0.1 ns is achieved. On the other hand, in the related art in which a bulk semiconductor substrate is used and an n-type well region is set in an electrically floating state, the turn-OFF time is 100 ns or more, and an OFF time of 10 ns may not be achieved. Besides, in the related art in which a SOI substrate is used, the turn-OFF time is 10 ns or more, and a turn-OFF time of 1 ns may not be achieved. Thus, the semiconductor device 1 in one embodiment of the present invention can shorten the turn-OFF time by a factor of not less than one order of magnitude, as compared with those according to the related art.

TABLE 1

|  | Turn-OFF time | | | | |
| --- | --- | --- | --- | --- | --- |
|  | 1000 ns | 100 ns | 10 ns | 1 ns | 0.1 ns |
| Present invention, Bulk substrate is used, N-type well: biased | OK | OK | OK | OK | OK |
| Related art, Bulk substrate is used N-type well: floating | OK | OK | NG | NG | NG |
| Related art, SOI substrate is used | OK | OK | OK | NG | NG |

OK: operable;
NG: non-operable

As has been described above, according to the semiconductor device in one embodiment of the present invention, excess carriers (electrons) in the second p-type region p2 are forcibly swept out to the well region 11 side without dependence on the electric field applied from the gate electrode 13 of the thyristor 2, so that the erasing time can be shortened, and a fast turn-OFF operation can be realized. This ensures that a high device speed comparable to or higher than that in a configuration using a SOI substrate can be achieved, notwithstanding the use of a bulk semiconductor substrate.

In addition, according to the method of driving a semiconductor device in one embodiment of the present invention, excess carriers (electrons) in the second p-type region p2 are forcibly swept out to the well region 11 side without dependence on the electric field applied from the gate electrode 13, so that the erasing time can be shortened, and a fast turn-OFF operation can be realized. This ensures that a high device speed comparable to or higher than that in a configuration using a SOI substrate can be achieved, notwithstanding the use of a bulk semiconductor substrate.

Now, a first example of one embodiment of the method of producing a thyristor region in the semiconductor device in the present invention will be described below, referring to manufacturing step sectional views shown in FIGS. 6 to 8. This production method is an example of the method of producing the thyristor 2 in the semiconductor device 1 described referring to FIG. 1 above.

Figure 6A:
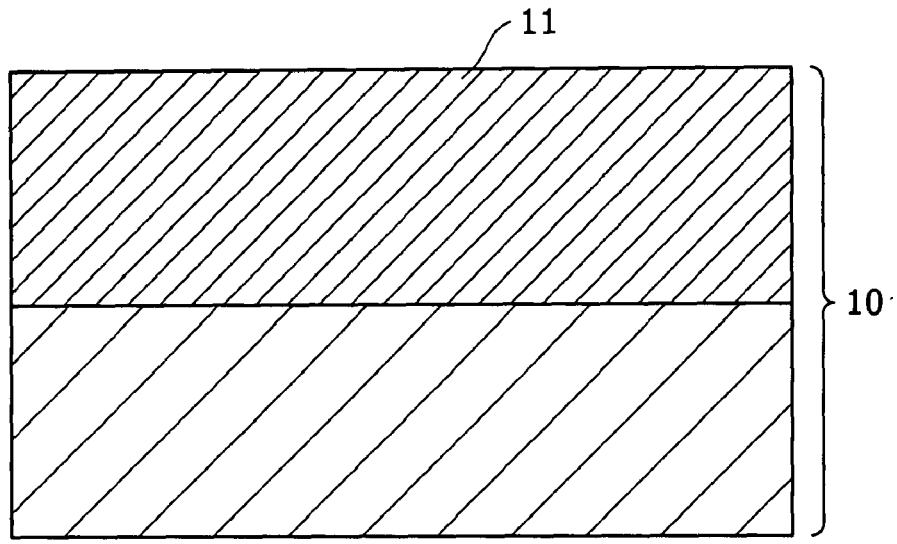
FIGS. 6A to 6C are manufacturing step sectional views showing one example of the method of manufacturing a thyristor part of the semiconductor device in the present invention.

As shown in FIG. 6A, for example, a silicon substrate is used as a bulk semiconductor substrate 10. Specifically, a bulk silicon substrate such as a CZ silicon wafer is used. The bulk semiconductor substrate 10 is formed with device isolating regions (not shown) for isolating device forming regions from each other, a well region 11 of a second conduction type (n type) in each device forming region, etc. The well region 11 is formed, for example, by an ion implantation process using a mask (not shown). In this case, the ion implantation concentration is in the range of $1\times10^{16}$ to $1\times10^{20}$ $cm^{-3}$, preferably about $1\times10^{17}$ to $1\times10^{18}$ $cm^{-3}$. In addition, as for the depth direction, the junction to a second p-type region p2 (described later) is desirably shallower than the depth of the device isolating regions, and more desirably shallower than the depth of the device isolating regions in consideration of the extension of a depletion layer when a voltage is impressed. Incidentally, in FIG. 6B and the latter figures, the bulk semiconductor substrate 10 is omitted.

Figure 6B:
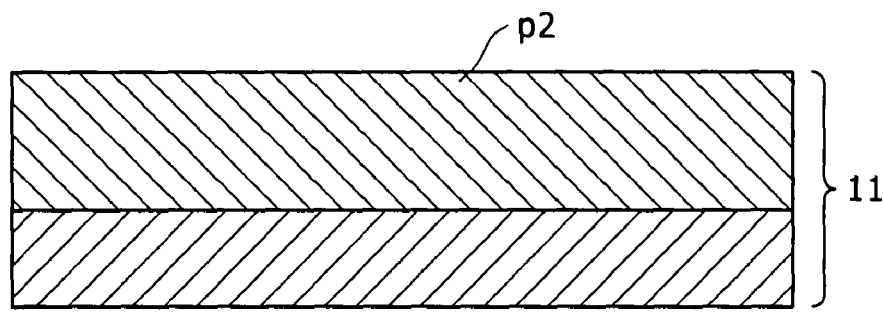

Next, as shown in FIG. 6B, an upper part of the well region 11 is formed to be a region of a first conduction type (p type). This p-type region becomes a second p-type region p2 of the thyristor. As for the ion implantation conditions in this instance, for example, boron (B) as a p-type dopant is used, and the dose is so set as to obtain a dopant concentration of, for example, $5\times10^{18}$ $cm^{-3}$. The dopant concentration is desirably in the range of about $1\times10^{18}$ to $1\times10^{19}$ $cm^{-3}$, and should basically be lower than the dopant concentration in a first n-type region of a second conduction type (n type) which will be formed later. In addition, an other p-type dopant than boron (B), such as indium (In) may also be used.

Figure 6C:
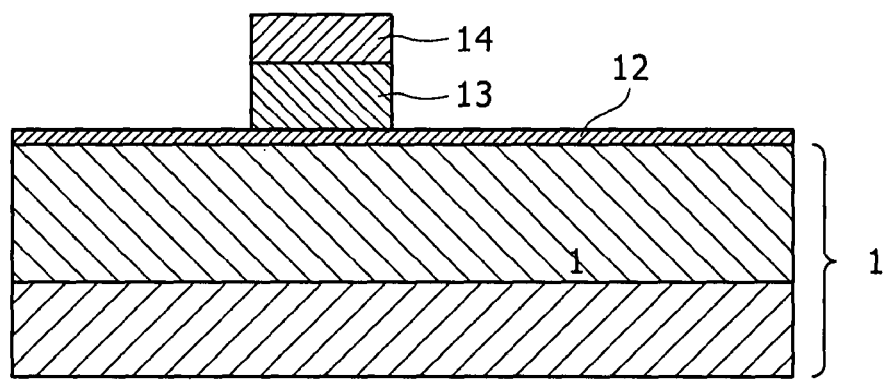

Subsequently, as shown in FIG. 6C, a gate insulating film 12 is formed over the well region 11. The gate insulating film 12 is composed, for example, of a silicon oxide ($SiO_2$) film, in a thickness of about 1 to 20 nm. The material forming the gate insulating film 12 is not limited to silicon oxide ($SiO_2$). Examples of the material which can be used include not only silicon oxynitride (SiON) but also gate insulating film materials investigated for application to ordinary CMOS transistors, such as hafnium oxide ($HfO_2$), hafnium oxynitride (HfON), aluminum oxide ($Al_2O_3$), hafnium oxysilicide (HfSiO), hafnium oxysilicide nitride (HfSiON), and lanthanum oxide ($La_2O_3$).

Next, a gate electrode 13 is formed on the gate insulating film 12 in the region to be a second p-type region p2. The gate electrode 13 is usually formed of polycrystalline silicon. Or, a metal gate electrode may be used, or the gate electrode may be formed of silicon-germanium (SiGe) or the like.

The gate electrode 13 may be formed, for example, by a method in which a gate electrode forming film is formed on the gate insulating film 12, then an etching mask is formed by the usual resist application and lithography technique, and the gate electrode forming film is etched by an etching technique using the etching mask. As the etching technique, an ordinary dry etching technique can be used. Or, alternatively, wet etching may also be used. In addition, a silicon oxide ($SiO_2$) film, a silicon nitride ($Si_3N_4$) film or the like may be formed as a hard mask 14 on the gate electrode forming film.

Figure 7A:
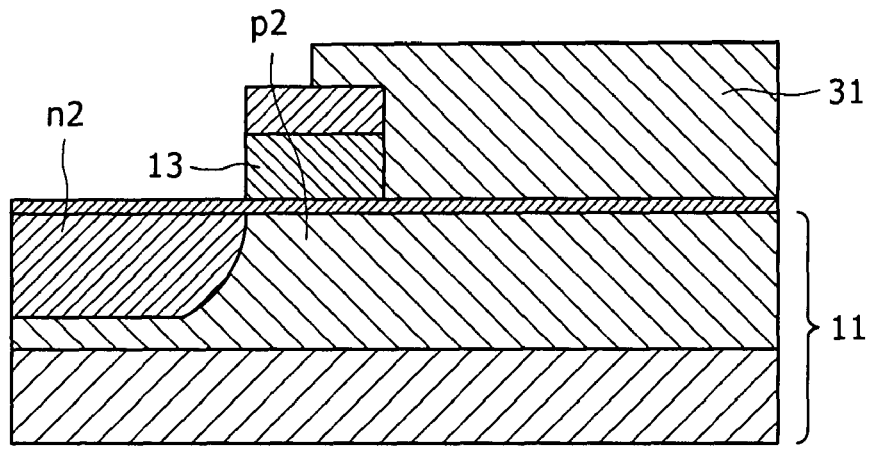
FIGS. 7A to 7C are manufacturing step sectional views showing one example of the method of manufacturing a thyristor part of the semiconductor device in the present invention.

Subsequently, as shown in FIG. 7A, an ion implantation mask 31 opened on one side of the gate electrode 13, i.e., opened in the region where to form a second n-type region, is formed by the usual resist application and lithography technique. Then, by an ion implantation technique using the ion implantation mask 31, an n-type dopant is introduced into the second p-type region p2 formed in the well region 11 on one side of the gate electrode 13, to form the second n-type region n2. As for the ion implantation conditions, for example, phosphorus (P) is used as a dopant, and a dose is so set as to obtain a dopant concentration of, for example, $1\times10^{19}$ $cm^{-3}$. The dopant concentration is desirably in the range of about $1\times10^{18}$ to $1\times10^{21}$ $cm^{-3}$, and should be higher than the dopant concentration in the second p-type region p2. Phosphorus may be replaced by an other n-type dopant, such as gallium, arsenic, and antimony. Thereafter, the ion implantation mask 31 is removed.

Subsequently, annealing for activation, for example, spike annealing at 1050° C. for 0. second is conducted. It suffices to select the annealing conditions within such ranges as to enable activation of the dopant.

Figure 7B:
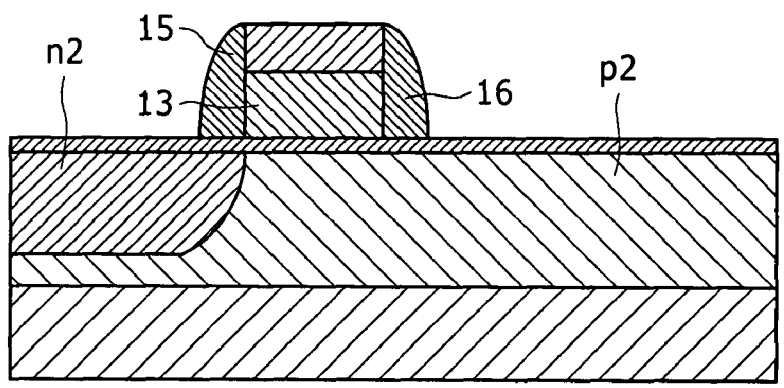

Next, as shown in FIG. 7B, side walls 15 and 16 are formed on side walls of the gate electrode 13. For example, a side wall forming film is formed in such a manner as to cover the gate electrode 13, and the side wall forming film is etched back, whereby the side walls 15 and 16 can be formed. The side walls 15 and 16 may be formed of either one of silicon oxide ($SiO_2$) and silicon nitride ($Si_3N_4$) or may be composed of a laminate film of both of them. In addition, the side walls may be formed before the later ion implantation step for forming the second n-type region. Incidentally, the thickness of the side walls 15 and 16 is, for example, so set that the junction between the second p-type region p2 and the first n-type region to be formed later will be located between the gate electrode 13 and a second gate electrode (not shown) which is to be formed over the first n-type region. Such a setting ensures that a sufficient effect on formation of the second gate electrode can be obtained.

Figure 7C:
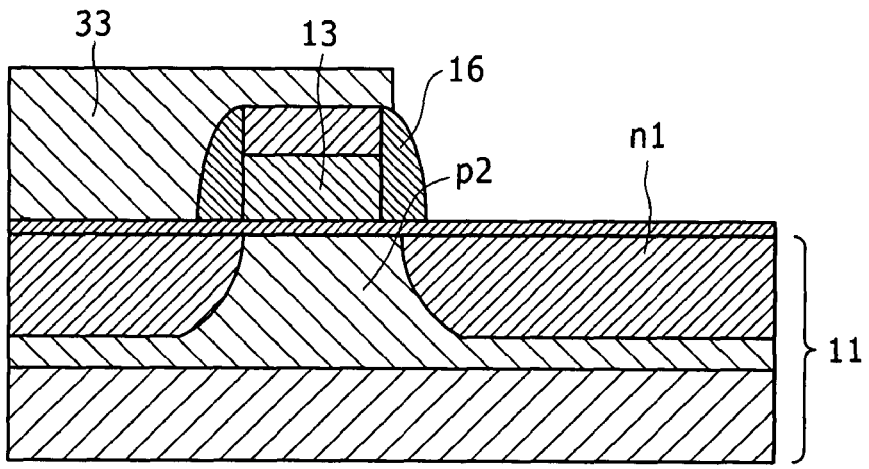

Subsequently, as shown in FIG. 7C, an ion implantation mask 33 opened on the other side of the gate electrode 13, i.e., opened in the region where to form the first n-type region, is formed by the usual resist application and lithography technique. Then, by an ion implantation technique using the ion implantation mask 33, a second conduction type (n type) dopant is introduced into the second p-type region p2 formed in the well region 11 on the other side of the gate electrode 13 with the side wall 15 therebetween, to form a first n-type region n1 of the second conduction type (n type). As for the ion implantation conditions, for example, phosphorus (P) is used as a dopant, and a dose is so set as to obtain a dopant concentration of, for example, $1.5\times10^{19}$ $cm^{-3}$. The dopant concentration is desirably in the range of about $1\times10^{18}$ to $1\times10^{21}$ $cm^{-3}$, and should be higher than the dopant concentration in the second p-type region p2. Phosphorus may be replaced by an other n-type dopant, such as gallium, arsenic, and antimony. Thereafter, the ion implantation mask 33 is removed.

Subsequently, annealing for activation, for example, spike annealing at 1050° C. for 0. second is conducted. It suffices to select the annealing conditions within such ranges as to enable activation of the dopant.

Figure 8A:
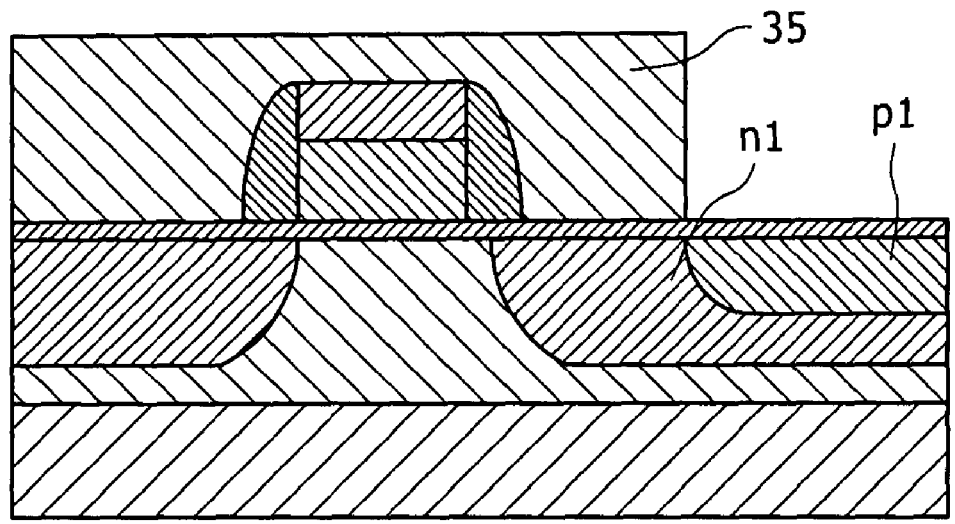
FIGS. 8A and 8B are manufacturing step sectional views showing one example of the method of manufacturing a thyristor part of the semiconductor device in the present invention.

Next, as shown in FIG. 8A, an ion implantation mask 35 opened in the region where to form a first p-type region of the first n-type region n1, is formed by the usual resist application and lithography technique. Then, by an ion implantation technique using the ion implantation mask 35, a p-type dopant is introduced into an upper layer of part of the first n-type region n1, to form the first p-type region p1. As for the ion implantation conditions, for example, boron (B) is used as a dopant, and a dose is so set as to obtain a dopant concentration of, for example, $1\times10^{20}$ cm$^{-3}$. The dopant concentration is desirably in the range of about $1\times10^{18}$ to $1\times10^{21}$ cm$^{-3}$, and should be higher than the dopant concentration in the first n-type region n1. In addition, side walls may be formed before the ion implantation, and the dopant may be any p-type impurity, such as indium (In) and aluminum (Al). Thereafter, the ion implantation mask 35 is removed.

Subsequently, annealing for activation, for example, spike annealing at 1050° C. for 0. second is conducted. It suffices to select the annealing conditions within such ranges as to enable activation of the dopant.

Figure 8B:
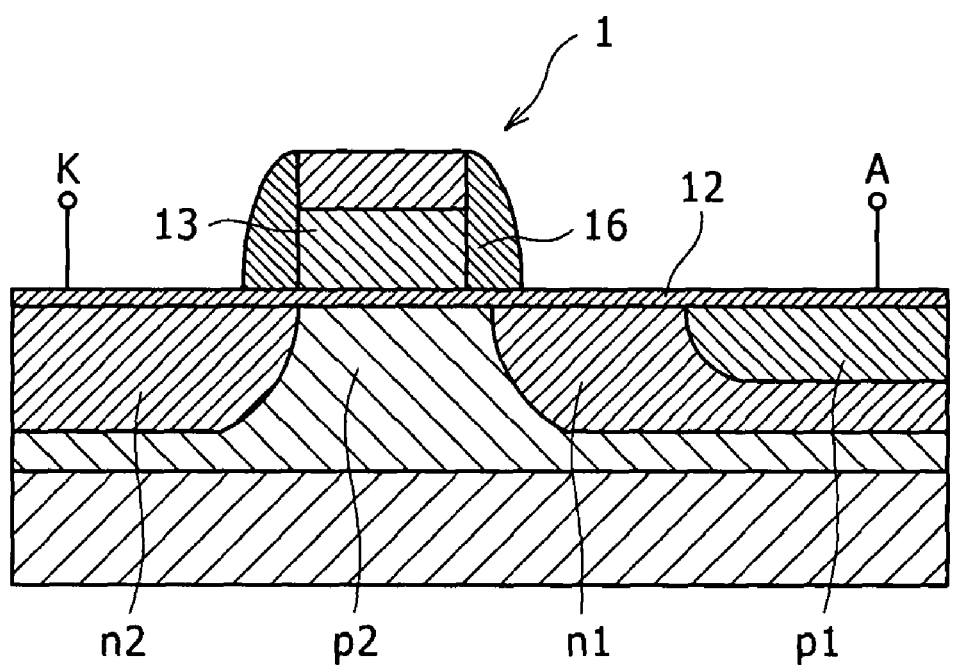

Next, as shown in FIG. 8B, an anode A to be connected to the first p-type region p1 and a cathode K to be connected to the second n-type region n2 are formed by the usual electrode forming technique. In this instance, a silicide (TiSi, CoSi, NiSi or the like) is preferably formed by a salicide step at exposed parts of the first p-type region p1 and the second n-type region n2 at both end parts. In this case, it is recommendable to preliminarily form salicide blocks as shown in FIG. 1 above, by use of the mask for forming the side walls. Thereafter, a wiring step similar to that in the usual CMOS process is carried out.

Now, a mode of contact with the well region in the semiconductor device in an embodiment of the present invention will be described below. First, a first embodiment of the mode of contact will be described referring to FIG. 9.

Figure 9:
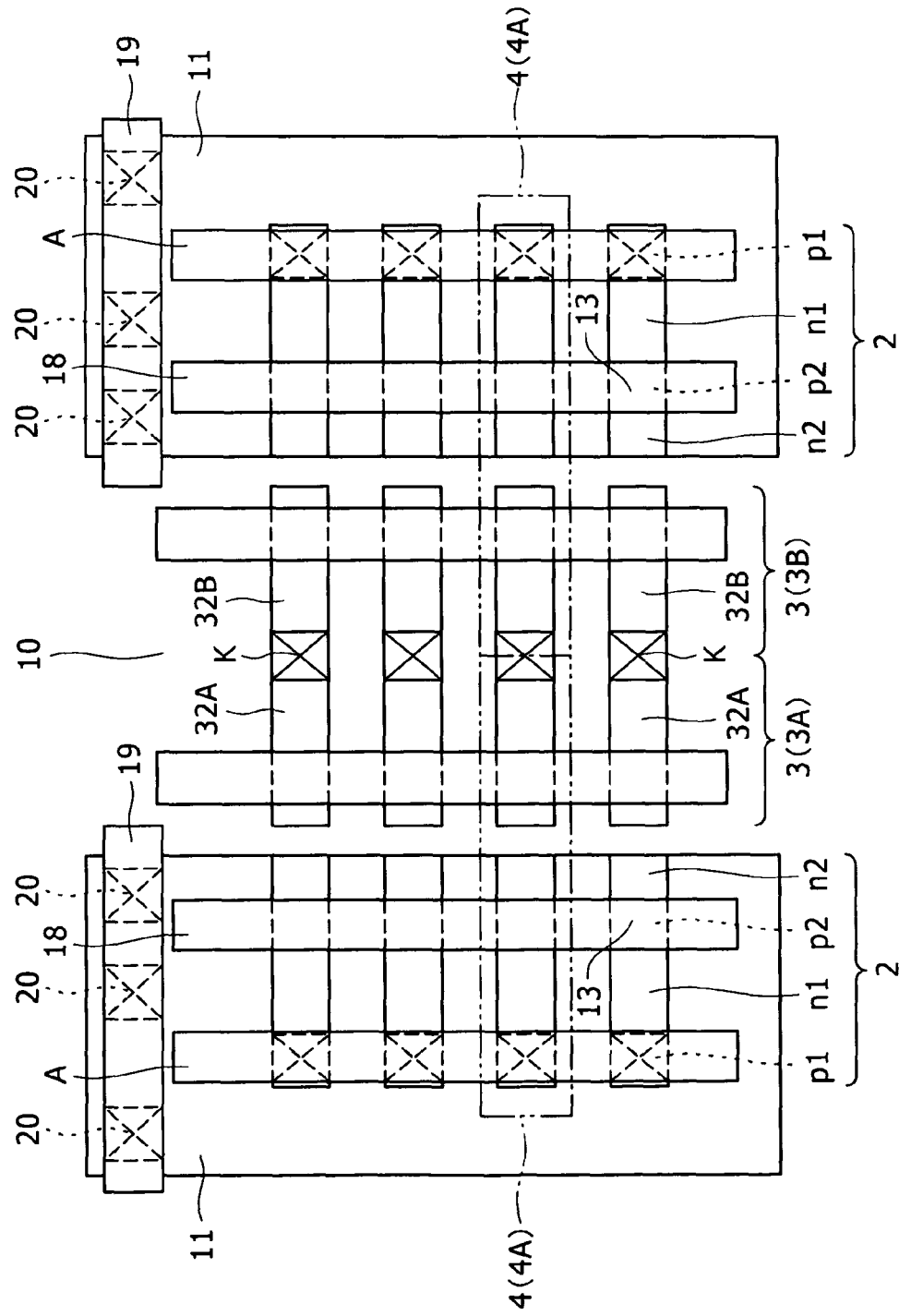
FIG. 9 is a layout diagram showing a mode of first embodiment of contact with a well region of the semiconductor device in the present invention.

As shown in FIG. 9, device forming regions are partitioned by device isolating regions 31 in a bulk semiconductor substrate 10, and a thyristor 2 is formed in each device forming region. As the bulk semiconductor substrate 10, for example, a bulk silicon substrate is used. The thyristor 2 has a third region of the first conduction type (second p-type region) p2. A thyristor word line 18 connected to the gate electrode 13 with the gate insulating film 12 therebetween is formed over the second p-type region p2. Here, the thyristor word lines 18 and the gate electrodes 13 are formed of the same wirings. In addition, the second region of the second conduction type (first n-type region) n1 is formed at an upper layer of the second p-type region p2 on one side of the gate electrode 13, and the fourth region of the second conduction type (second n-type region) n2 is formed at an upper layer of the second p-type region p2 on the other side. Besides, the first region of the first conduction type (first p-type region) p1 is formed at an upper layer of the first n-type region n1 so that the first n-type region n1 does not make contact with the second p-type region p2. In addition, the well region 11 of the second conduction type (n type) is formed in the bulk semiconductor substrate 10 on the lower side of the second p-type region p2.

Further, the anode A is connected to the first p-type region p1, and the cathode (not shown) is connected to the second n-type region n2.

In addition, the field effect transistor 3 to be a selecting transistor is formed in the bulk semiconductor substrate 10 adjacently to the thyristor 2. Besides, one thyristor 2 and one field effect transistor 3 adjacent to the thyristor 2 constitute a unit cell 4. A plurality of unit cells 4 are arrayed in the direction parallel to the laying direction of the thyristor word lines 18.

In addition, in the unit cell 4 (4A) and the unit cell 4 (4B) adjacent thereto, a diffusion layer 32A connected to a bit line contact (cathode K) of the field effect transistor 3 (3A) in the unit cell 4A and a diffusion layer 32B connected to a bit line contact (cathode K) of the field effect transistor 3 (3B) in the unit cell 4B adjacent to and on one side of the unit cell 4A are used in common. Therefore, the bit line contacts (cathode K) are also in common to the unit cells.

Each well region 11 is formed in parallel to the laying direction of the thyristor word lines 18, and is formed in common to a plurality of unit cells, each of which includes the thyristor 2 and the field effect transistor (selecting transistor) 3. Therefore, the well region 11 is formed in junction to a lower part of the second p-type region p2 of each unit cell.

Contacts 20 for connection between a well wiring 19 for controlling a bias for the well region 11 and the well region 11 are disposed at a cell end part of the well region 11. While the figure shows a configuration in which the contacts 20 are formed on one end side of the well region 11, the contacts 20 may be arranged at both ends of the well region 11. The contact(s) 20 may be singular or plural. In addition, the well wiring 19 is arranged, for example, in a direction orthogonal to the thyristor word lines 18.

Besides, the adjacent well regions 11 may be connected to each other at a cell end. This connection can be made by use of the well line 19, for example.

In the configuration of the contacts 20 in the first embodiment, the contacts 20 are disposed at the cell end of the well region 11, whereby the cell area is little increased due to the arrangement of the contacts.

Now, a second embodiment of the mode of contact will be described below, referring a layout diagram in FIG. 10.

Figure 10:
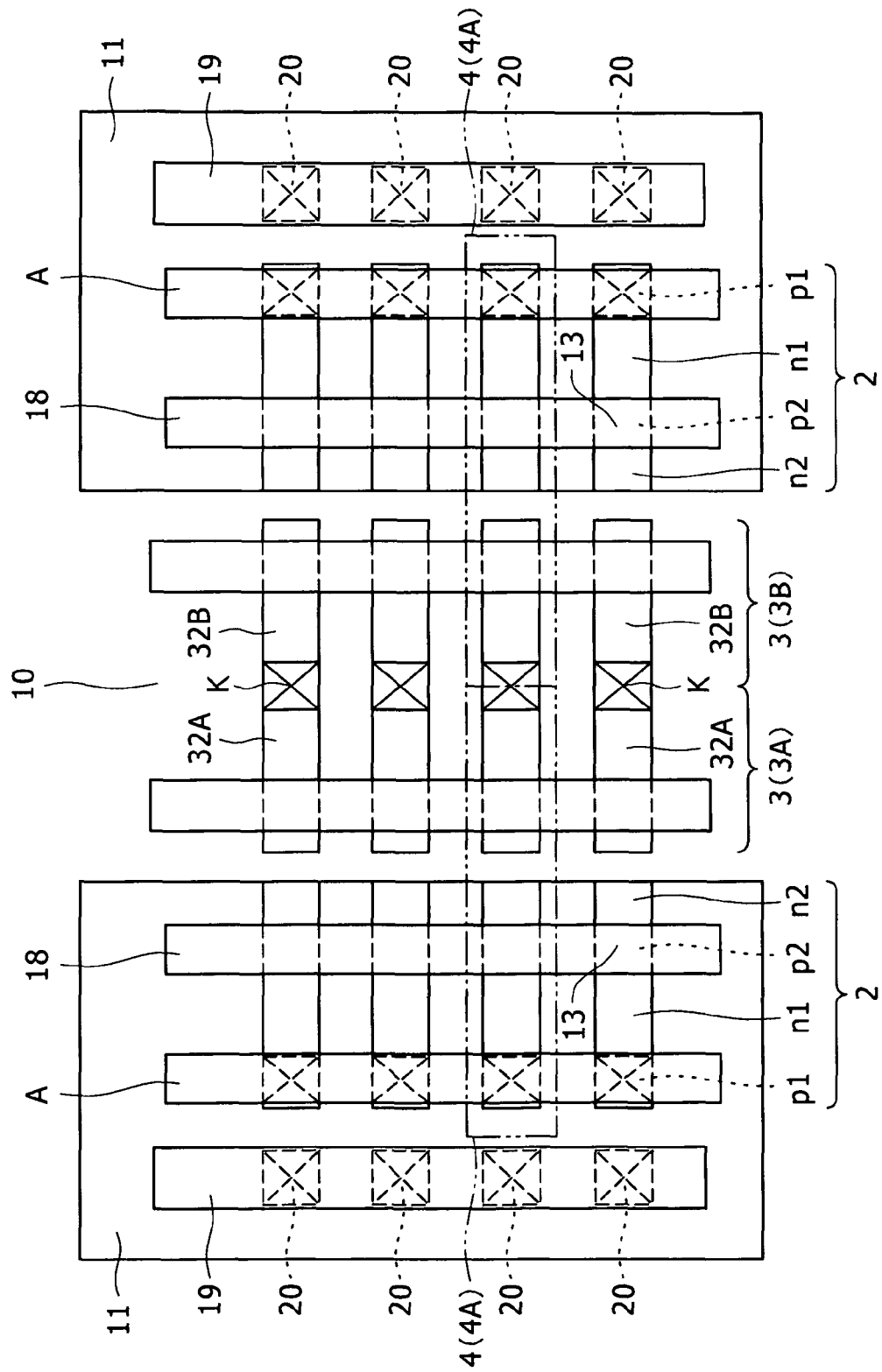
FIG. 10 is a layout diagram showing a mode of second embodiment of contact with a well region of the semiconductor device in the present invention.

As shown in FIG. 10, device forming regions are partitioned by device isolating regions 31 in a bulk semiconductor substrate 10, and a thyristor 2 is formed in each device forming region. As the bulk semiconductor substrate 10, for example, a bulk silicon substrate is used. The thyristor 2 has a third region of the first conduction type (second p-type region) p2. A thyristor word line 18 including the gate electrode 13 with the gate insulating film 12 therebetween is formed over the second p-type region p2. In addition, the second region of the second conduction type (first n-type region) n1 is formed at an upper layer of the second p-type region p2 on one side of the gate electrode 13, and the fourth region of the second conduction type (second n-type region) n2 is formed at an upper layer of the second p-type region p2 on the other side. Besides, the first region of the first conduction type (first p-type region) p1 is formed at an upper layer of the first n-type region n1 so that the first n-type region n1 does not make contact with the second p-type region p2. In addition, the well region 11 of the second conduction type (n type) is formed in the bulk semiconductor substrate 10 on the lower side of the second p-type region p2.

Further, the anode A is connected to the first p-type region p1, and the cathode (not shown) is connected to the second n-type region n2.

In addition, the field effect transistor 3 to be a selecting transistor is formed in the bulk semiconductor substrate 10 adjacently to the thyristor 2.

Each well region 11 is formed in parallel to the laying direction of the thyristor word lines 18, and is formed in common to a plurality of unit cells, each of which includes the thyristor 2 and the field effect transistor (selecting transistor) 3. Therefore, the well region 11 is formed in junction to a lower part of the second p-type region p2 of each unit cell.

Contacts 20 for connection between a well wiring 19 for controlling a bias for the well region 11 and the well region 11 are disposed in a direction along the laying direction of the thyristor word lines 18, for example, in a direction parallel to the laying direction of the thyristor word line 18, in the well region 11. The contact(s) 20 connected to one well region 11 may be either singular or plural. The contact(s) 20 may be a contact shaped to be elongate along the thyristor word line 18, or a plurality of circular (square on a design basis) contacts arranged along the laying direction of the thyristor word line

18. In the figure, an example in which a plurality of contacts 20 are arranged is shown. In addition, the well wiring 19 is arranged, for example, in a direction orthogonal to the laying direction of the thyristor word lines 18.

In addition, as shown in the figure, in a configuration wherein one thyristor 2 and one field effect transistor 3 constitute a unit cell 4 and a plurality of such unit cells 4 are arranged along the laying direction of the thyristor word lines 18, each contact 20 may correspond to each unit cell 4. Or, alternatively, though not shown, each contact 20 may correspond to a plurality of unit cells 4.

Besides, the well regions 11 adjacent to each other along the laying direction of the thyristor word lines 18 may be connected to each other. This connection may be made by use of the well wiring 19.

In the configuration of the contacts 20 in the second embodiment as above, the contacts 20 are each disposed in correspondence with each unit cell 4 or in correspondence with a plurality of unit cells 4, whereby the potential drop and delay due to the well resistance can be suppressed, as compared with the case of the first embodiment. In the first embodiment above, it is considered that the potential drop and delay are enlarged due to the well resistance in the unit cells 4 remote from the cell end (contact end) of the well region 11. On the other hand, in the second embodiment, the distance between each unit cell 4 and the contact 20 is shortened, so that the potential drop and delay due to the well resistance can be suppressed.

Now, a third embodiment of the mode of contact will be described below, referring to a layout diagram in FIG. 11.

Figure 11:
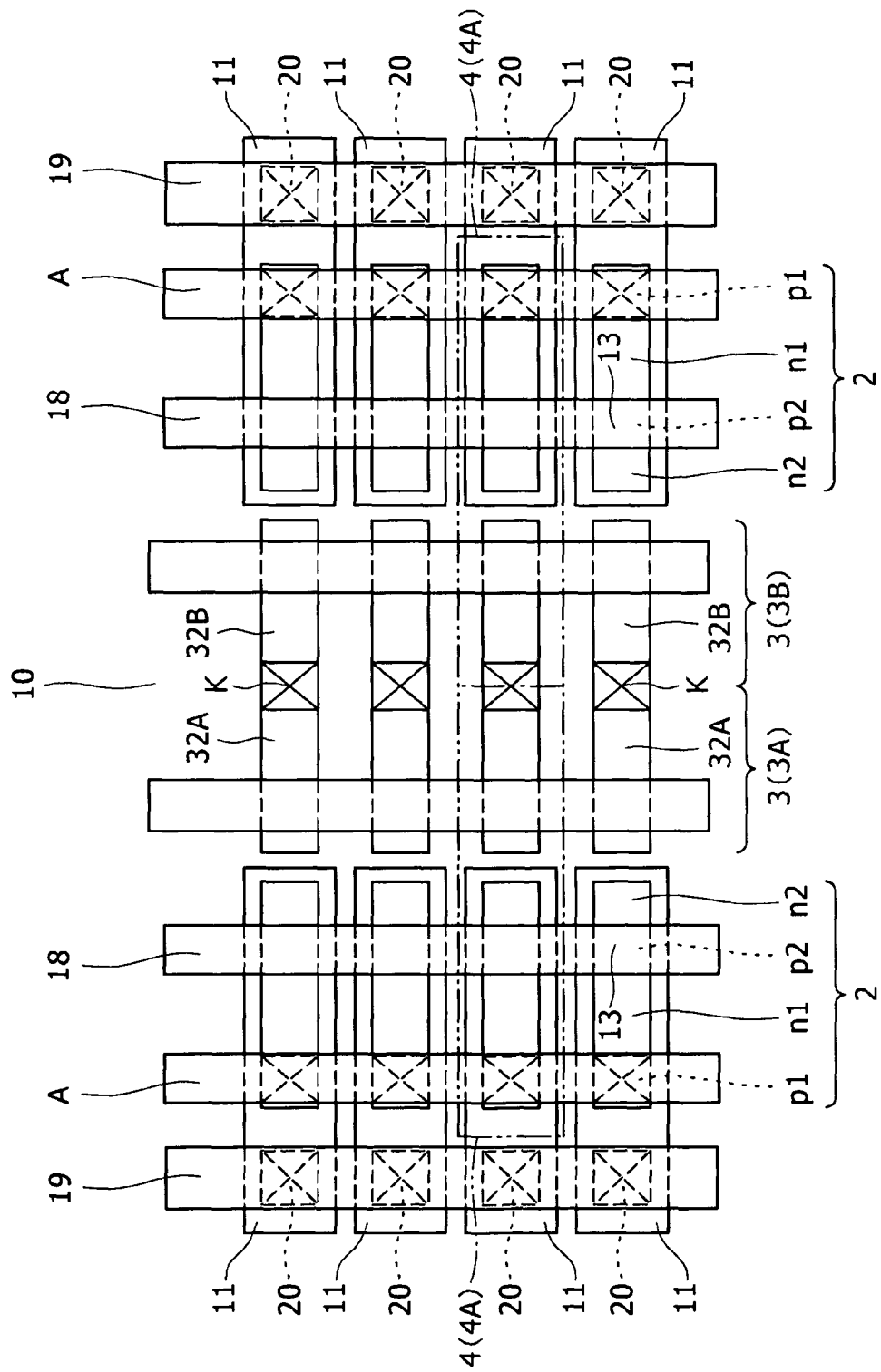
FIG. 11 is a layout diagram showing a mode of third embodiment of contact with a well region of the semiconductor device in the present invention.

As shown in FIG. 11, device forming regions are partitioned by device isolating regions 31 in a bulk semiconductor substrate 10, and a thyristor 2 is formed in each device forming region. As the bulk semiconductor substrate 10, for example, a bulk silicon substrate is used. The thyristor 2 has a third region of the first conduction type (second p-type region) p2. A thyristor word line 18 including the gate electrode 13 with the gate insulating film 12 therebetween is formed over the second p-type region p2. In addition, the second region of the second conduction type (first n-type region) n1 is formed at an upper layer of the second p-type region p2 on one side of the gate electrode 13, and the fourth region of the second conduction type (second n-type region) n2 is formed at an upper layer of the second p-type region p2 on the other side. Besides, the first region of the first conduction type (first p-type region) p1 is formed at an upper layer of the first n-type region n1 so that the first n-type region n1 does not make contact with the second p-type region p2. In addition, the well region 11 of the second conduction type (n type) is formed in the bulk semiconductor substrate 10 on the lower side of the second p-type region p2.

Further, the anode A is connected to the first p-type region p1, and the cathode (not shown) is connected to the second n-type region n2.

In addition, the field effect transistor 3 to be a selecting transistor is formed in the bulk semiconductor substrate 10 adjacently to the thyristor 2. Besides, one thyristor 2 and one field effect transistor 3 adjacent to the thyristor 2 constitute a unit cell 4. A plurality of unit cells 4 are arrayed in the direction parallel to the laying direction of the thyristor word lines 18.

In addition, in the unit cell 4 (4A) and the unit cell 4 (4B) adjacent thereto, a diffusion layer 32A connected to a bit line contact (cathode K) of the field effect transistor 3 (3A) in the unit cell 4A and a diffusion layer 32B connected to a bit line contact (cathode K) of the field effect transistor 3 (3B) in the unit cell 4B adjacent to and on one side of the unit cell 4A are used in common. Therefore, the bit line contacts (cathode K) are also in common to the unit cells.

The well regions 11 are formed independently on the basis of each unit cell 4, and are arrayed in the direction parallel to the laying direction of the thyristor word lines 18, like the unit cells 4.

Contacts 20 for connection between a well wiring 19 for controlling a bias for the well region 11 and the well region 11 are disposed in a direction along the laying direction of the thyristor word lines 18, for example, in a direction parallel to the laying direction of the thyristor word line 18, in the well region 11. In addition, the well wiring 19 is arranged, for example, in a direction orthogonal to the laying direction of the thyristor word lines 18.

In the configuration of the contacts 20 in the third embodiment as above, the contacts 20 are each disposed in correspondence with each unit cell 4, whereby the potential drop and delay due to the well resistance can be suppressed, as compared with the case of the first embodiment. In the first embodiment above, it is considered that the potential drop and delay are enlarged due to the well resistance in the unit cells 4 remote from the cell end (contact end) of the well region 11. On the other hand, in the third embodiment, the distance between each unit cell 4 and the contact 20 is shortened, so that the potential drop and delay due to the well resistance can be suppressed. In addition, a minimum cell area is realized in the configuration in which the well regions 11 are separated on the basis of each unit cell 4.

Now, a fourth embodiment of the mode of contact will be described below, referring to a layout diagram in FIG. 12.

Figure 12:
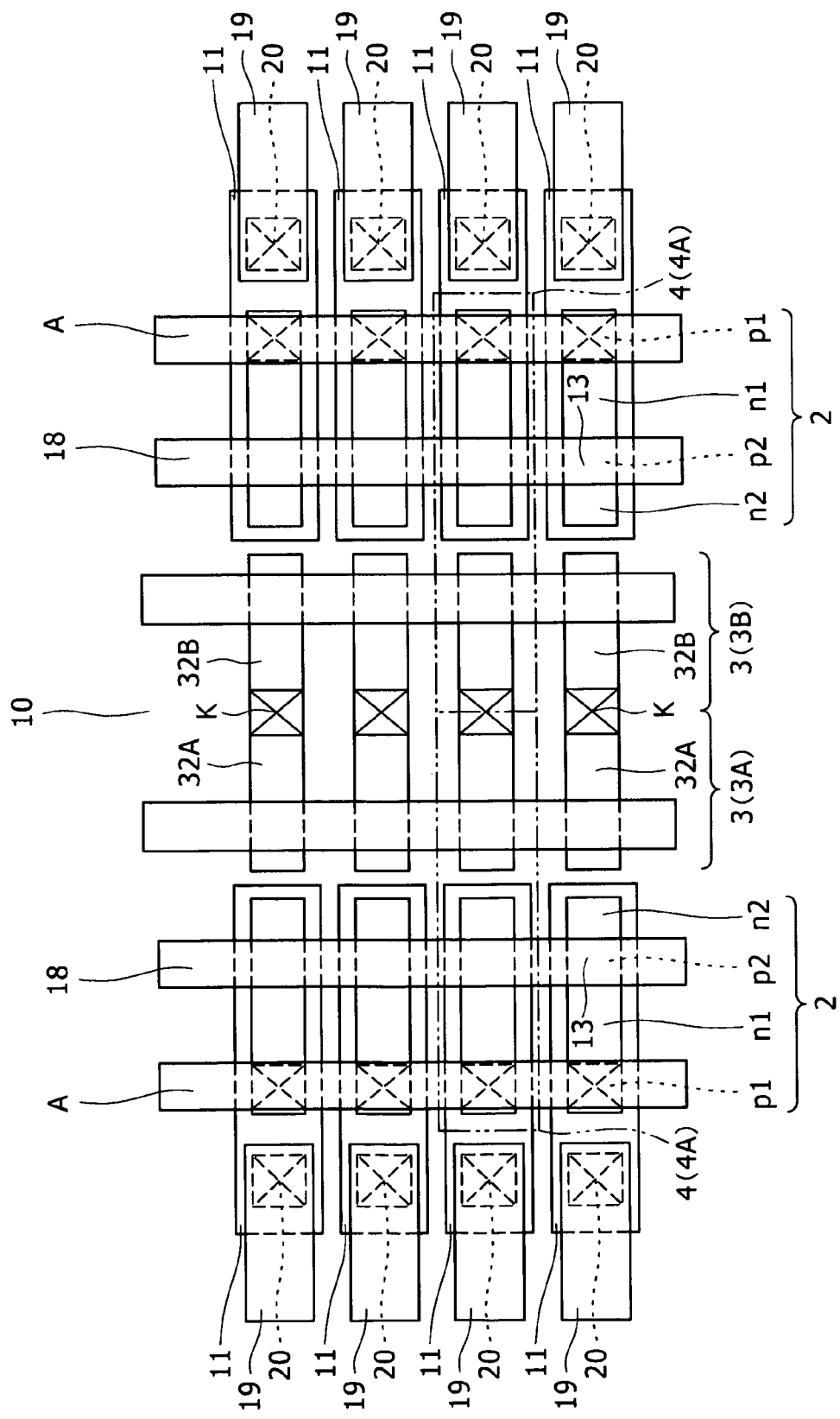
FIG. 12 is a layout diagram showing a mode of fourth embodiment of contact with a well region of the semiconductor device in the present invention.

As shown in FIG. 12, device forming regions are partitioned by device isolating regions 31 in a bulk semiconductor substrate 10, and a thyristor 2 is formed in each device forming region. As the bulk semiconductor substrate 10, for example, a bulk silicon substrate is used. The thyristor 2 has a third region of the first conduction type (second p-type region) p2. A thyristor word line 18 including the gate electrode 13 with the gate insulating film 12 therebetween is formed over the second p-type region p2. In addition, the second region of the second conduction type (first n-type region) n1 is formed at an upper layer of the second p-type region p2 on one side of the gate electrode 13, and the fourth region of the second conduction type (second n-type region) n2 is formed at an upper layer of the second p-type region p2 on the other side. Besides, the first region of the first conduction type (first p-type region) p1 is formed at an upper layer of the first n-type region n1 so that the first n-type region n1 does not make contact with the second p-type region p2. In addition, the well region 11 of the second conduction type (n type) is formed in the bulk semiconductor substrate 10 on the lower side of the second p-type region p2.

Further, the anode A is connected to the first p-type region p1, and the cathode (not shown) is connected to the second n-type region n2.

In addition, the field effect transistor 3 to be a selecting transistor is formed in the bulk semiconductor substrate 10 adjacently to the thyristor 2. Besides, one thyristor 2 and one field effect transistor 3 adjacent to the thyristor 2 constitute a unit cell 4. A plurality of unit cells 4 are arrayed in the direction parallel to the laying direction of the thyristor word lines 18.

In addition, in the unit cell 4 (4A) and the unit cell 4 (4B) adjacent thereto, a diffusion layer 32A connected to a bit line contact (cathode K) of the field effect transistor 3 (3A) in the unit cell 4A and a diffusion layer 32B connected to a bit line contact (cathode K) of the field effect transistor 3 (3B) in the unit cell 4B adjacent to and on one side of the unit cell 4A are used in common. Therefore, the bit line contacts (cathode K) are also in common to the unit cells.

The well regions 11 are formed independently on the basis of each unit cell 4, and are arrayed in a direction along the laying direction of the thyristor word lines 18, for example, in the direction parallel to the laying direction of the thyristor word line 18, like the unit cells 4.

Contacts 20 for connection between a well wiring 19 for controlling a bias for the well region 11 and the well region 11 are disposed in a direction parallel to the laying direction of the thyristor word line 18, in the well region 11. In addition, the well wiring 19 is arranged, for example, in a direction orthogonal to the laying direction of the thyristor word lines 18, and is connected to a peripheral circuit, though not shown. Therefore, the potential of each well region 11 can be controlled independently on the basis of each contact by the peripheral circuit.

In the configuration of the contacts 20 in the fourth embodiment as above, the well regions 11 are provided to be independent on the basis of each unit cell 4, so that the situation in which interference between the cells occurs to cause bad influences on the device operation can be obviated. In addition, the contacts 20 are each disposed in correspondence with each unit cell 4, whereby the potential drop and delay due to the well resistance can be suppressed, as compared with the case of the first embodiment. In the first embodiment above, it is considered that the potential drop and delay are enlarged due to the well resistance in the unit cells 4 remote from the cell end (contact end) of the well region 11. On the other hand, in the fourth embodiment, the distance between each unit cell 4 and the contact 20 is shortened, so that the potential drop and delay due to the well resistance can be suppressed. In addition, a minimum cell area is realized in the configuration in which the well regions 11 are separated on the basis of each unit cell 4.

In the configuration of the fourth embodiment, the well wiring 19 may be used in common for a number of unit cells, according to the degree of interference between the cells, within such a range that no bad influence of interference is exerted on the actual device operation. This ensures that the number of the well wirings 19 led out to peripheral circuits can be reduced, and the number of the peripheral circuits provided in correspondence with the well regions 11 can also be reduced.

Now, a fifth embodiment of the mode of contact will be described below, referring to a layout diagram in FIG. 13, FIG. 14 which is a sectional view taken along line A-A of FIG. 13, and FIG. 15 which is a sectional view taken along line B-B of FIG. 13.

Figure 13:
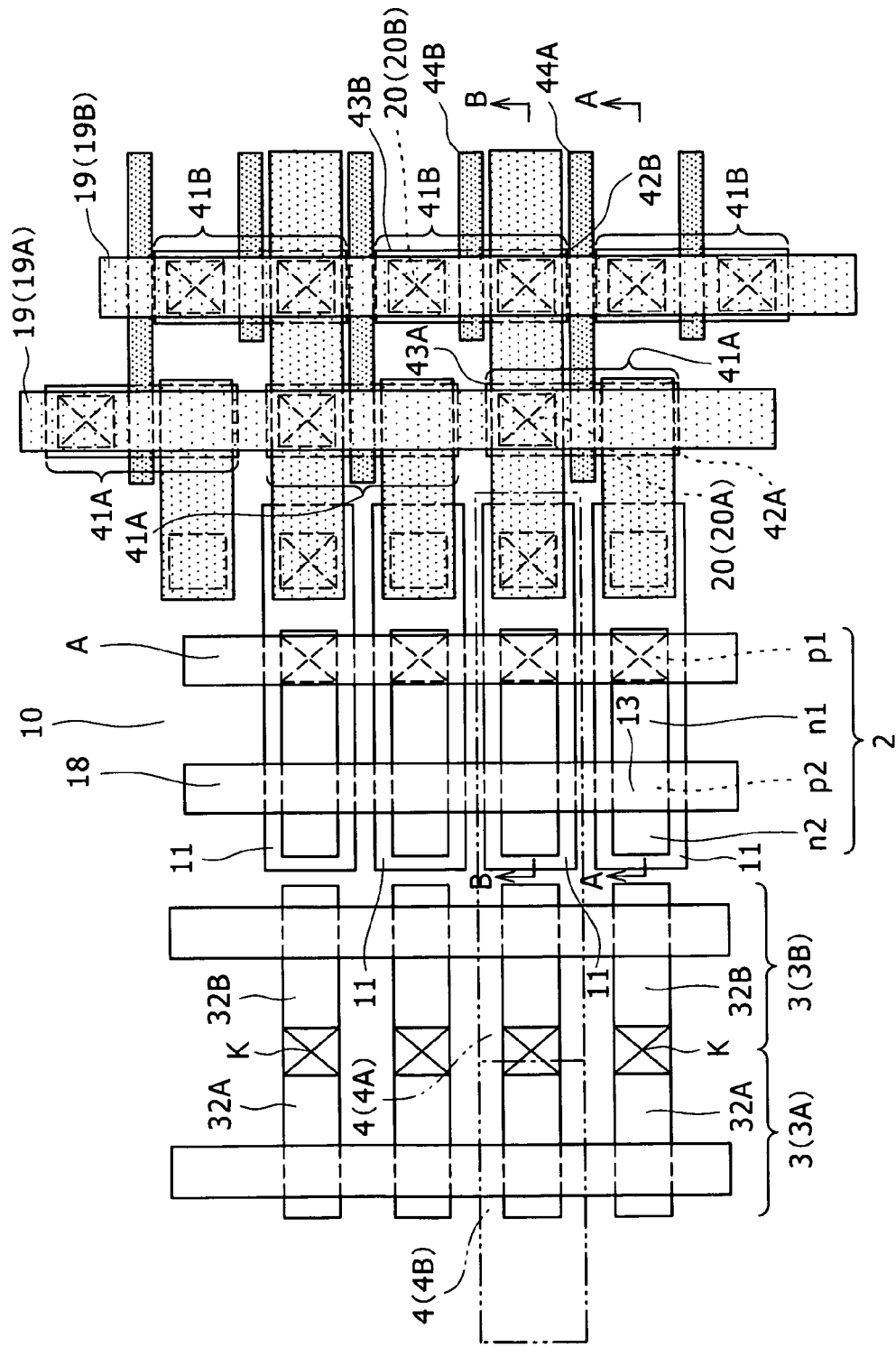
FIG. 13 is a layout diagram showing a mode of fifth embodiment of contact with a well region of the semiconductor device in the present invention.

As shown in FIG. 13, device forming regions are partitioned by device isolating regions 31 in a bulk semiconductor substrate 10, and a thyristor 2 is formed in each device forming region. As the bulk semiconductor substrate 10, for example, a bulk silicon substrate is used. The thyristor 2 has a third region of the first conduction type (second p-type region) p2. A thyristor word line 18 including the gate electrode 13 with the gate insulating film 12 therebetween is formed over the second p-type region p2. In addition, the second region of the second conduction type (first n-type region) n1 is formed at an upper layer of the second p-type region p2 on one side of the gate electrode 13, and the fourth region of the second conduction type (second n-type region) n2 is formed at an upper layer of the second p-type region p2 on the other side. Besides, the first region of the first conduction type (first p-type region) p1 is formed at an upper layer of the first n-type region n1 so that the first n-type region n1 does not make contact with the second p-type region p2. In addition, the well region 11 of the second conduction type (n type) is formed in the bulk semiconductor substrate 10 on the lower side of the second p-type region p2.

Further, the anode A is connected to the first p-type region p1, and the cathode (not shown) is connected to the second n-type region n2.

In addition, the field effect transistor 3 to be a selecting transistor is formed in the bulk semiconductor substrate 10 adjacently to the thyristor 2. Besides, one thyristor 2 and one field effect transistor 3 adjacent to the thyristor 2 constitute a unit cell 4. A plurality of unit cells 4 are arrayed in the direction parallel to the laying direction of the thyristor word lines 18.

In addition, in the unit cell 4 (4A) and the unit cell 4 (4B) adjacent thereto, a diffusion layer 32A connected to a bit line contact (cathode K) of the field effect transistor 3 (3A) in the unit cell 4A and a diffusion layer 32B connected to a bit line contact (cathode K) of the field effect transistor 3 (3B) in the unit cell 4B adjacent to and on one side of the unit cell 4A are used in common. Therefore, the bit line contacts (cathode K) are also in common to the unit cells.

The well regions 11 are formed independently on the basis of each unit cell 4, and are arrayed in a direction along the laying direction of the thyristor word lines 18, for example, in the direction parallel to the laying direction of the thyristor word line 18, like the unit cells 4.

In addition, a first well wiring 19A and a second well wiring 19B for controlling a bias for the well regions 11 are disposed in parallel to the thyristor word lines 18. The connection relationships of the first and second well wirings 19A, 19B with the well regions 11 will be described as follows.

As to the well regions 11 arrayed in the laying direction of the thyristor word lines 18, it is now assumed that well regions 11 (11A) and well regions 11 (11B) are alternately arrayed. A diffusion layer 42A on one side of the selecting transistor 41A is connected to the well region 11A by, for example, a first wiring 45, and the first well wiring 19A is connected to a diffusion layer 43A on the other side of the selecting transistor 41A through the contact 20 (20A). Similarly, a diffusion layer 42B on one side of the selecting transistor 41B is connected to the well region 11B by, for example, a second wiring 46, and the second well wiring 19B is connected to a diffusion layer 43B on the other side of the selecting transistor 41B through the contact 20 (20B).

Besides, the selecting transistor 41A is formed on the lower side of the first well wiring 19A, and the selecting transistor 41B is formed on the lower side of the second well wiring 19B. By the alternate arrangement of the well regions 11 to be connected respectively to the first well wiring 19A and the second well wiring 19B, the cell areas occupied by the selecting transistors 41A and 41B can be minimized. In addition, on a layout basis, a gate wiring 44A for each of the selecting transistors 41A is provided between the first wiring 45 and the contact 20 connected to the selecting transistor 41A, and is led out to the exterior by passing between the selecting transistors 41B, 41B adjacent to each other along the laying direction of the thyristor word lines 18. Besides, a gate wiring 44B for each of the selecting transistors 41B can be provided between the second wiring 46 and the contact 20 connected to the selecting transistor 41B.

Now, a vertical structural section of the first wiring 45 will be described below, referring to FIG. 14, which is a sectional view taken along line A-A of FIG. 13. Incidentally, in FIG. 14, layer insulation films between the wirings are omitted.

Figure 14:
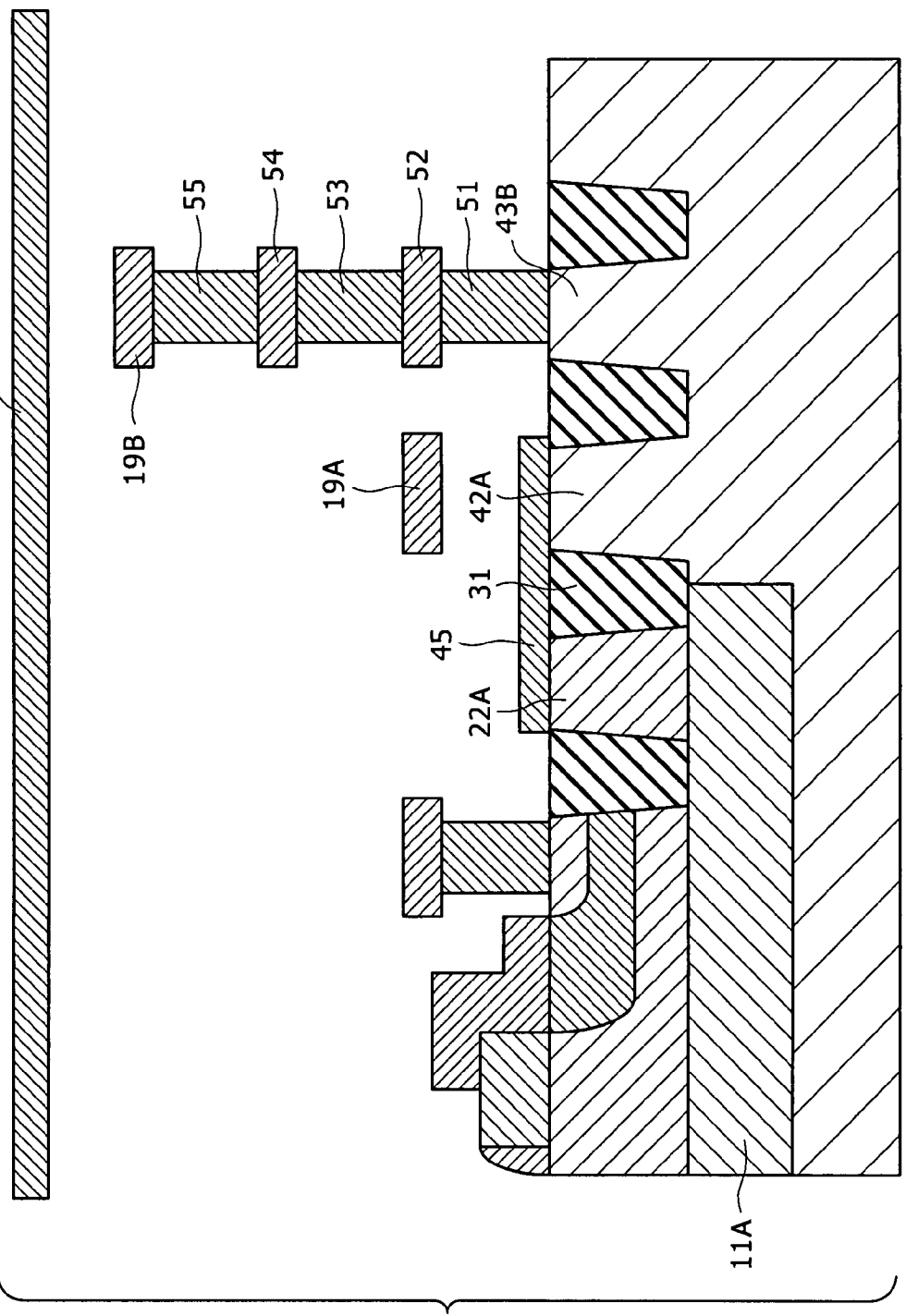
FIG. 14 is a sectional view taken along line A-A of FIG. 13.

As shown in FIG. 14, the first wiring 45 is connected on one side to the well region 11A through a lead-out diffusion layer 22A, and is connected on the other side to a lead-out diffusion layer 42A of the selecting transistor 41A [see FIG. 13]. The first well wiring 19A is disposed on the upper side of the selecting transistor 41A. A lead-out diffusion layer 43B of the selecting transistor 41B [see FIG. 13] is formed next to the lead-out diffusion layer 42A, with the device isolating region 31 therebetween. The second well wiring 19B is connected to the diffusion layer 43B through, for example, a contact 51, a wiring 52, a contact 53, a wiring 54, a contact 55 and the like. Further, a cathode line (bit line) K is disposed on the upper side of the second well wiring 19B.

Now, a vertical structural section of the second wiring 46 will be described below, referring to FIG. 15, which is a sectional view taken along line B-B of FIG. 13. Incidentally, in FIG. 15, layer insulation films between the wirings are omitted.

Figure 15:
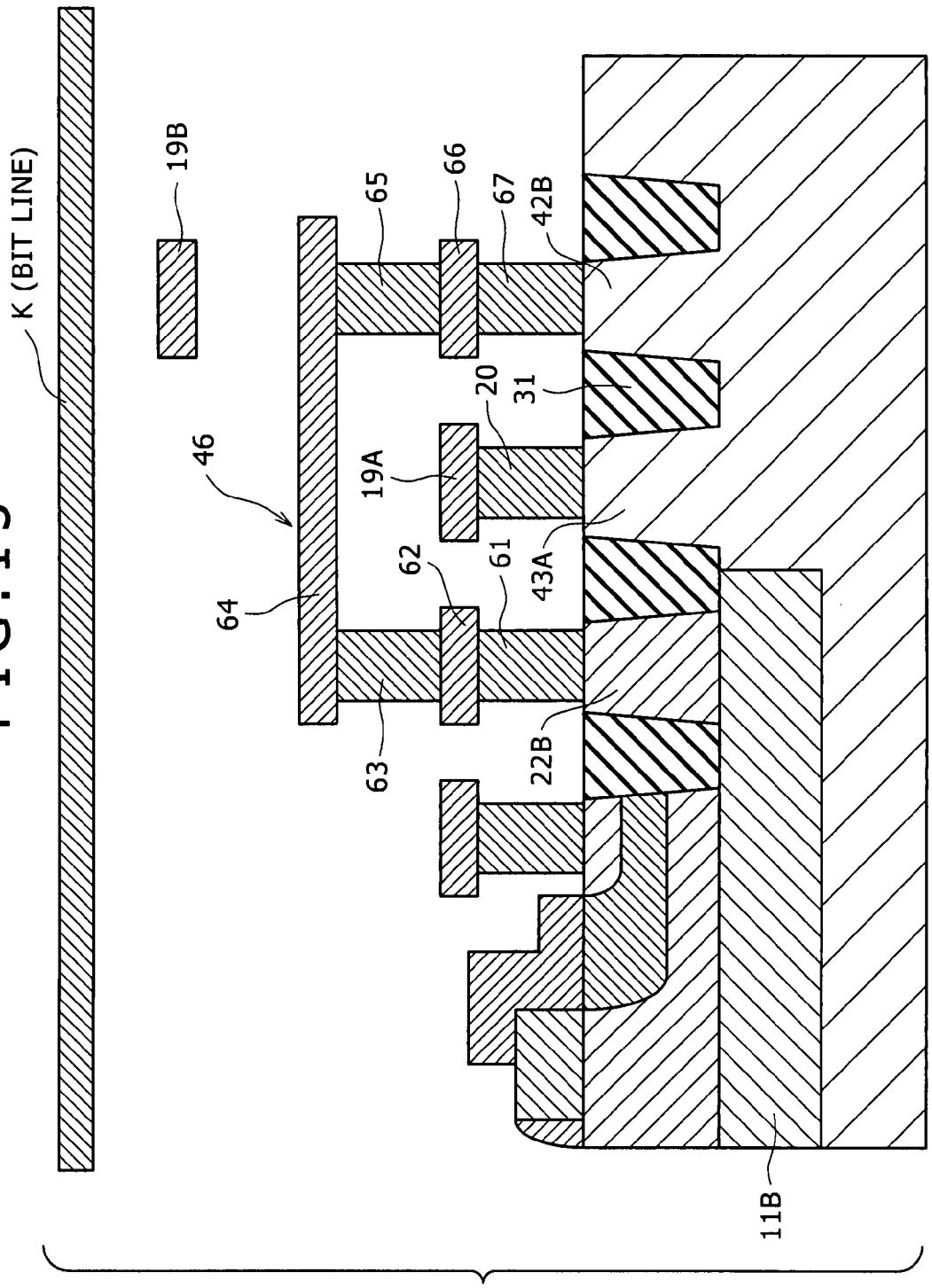
FIG. 15 is a sectional view taken along line B-B of FIG. 13.

As shown in FIG. 15, the second wiring 46 is connected on one side to the well region 11B through a lead-out diffusion layer 22B, and is connected on the other side to a diffusion layer 42B of the selecting transistor 41B [see FIG. 13]. The second wiring 46 includes, for example, a contact 61, a wiring 62, a contact 63, a wiring 64, a contact 65, a wiring 66, and a contact 67. Besides, the second well wiring 19B is disposed so as to traverse the upper side of the selecting transistor 41B and the upper side of the second wiring 46. A diffusion layer 43A of the selecting transistor 41A [see FIG. 13] is formed next to the diffusion layer 42B of the selecting transistor 41B, with the device isolating region 31 therebetween. The first well wiring 19A is connected to the diffusion layer 43A through the contact 20, for example. Further, a cathode line (bit line) K is disposed at an uppermost part.

In the configuration of the contacts 20 of the fifth embodiment, the selecting transistors 41A and 41B are each formed between the well region 11 in each unit cell 4 and the contact 20, so that the bias for the well regions 11 can be controlled independently on the basis of each unit cell 4 (bit) and, therefore, the need for leaking out the well wirings on the basis of each unit cell 4 is eliminated. In addition, since the well regions 11 are provided independently on the basis of each unit cell 4, the situation in which interference occurs between the cells to exert bad influences on the device operation can be obviated advantageously. Besides, since the contacts 20 are disposed in correspondence with each unit cell 4, the potential drop and delay due to the well resistance can be suppressed, as compared with the case of the first embodiment. In the first embodiment, it is considered that the potential drop and delay would be enlarged due to the well resistance in the unit cells 4 remote from the cell end (contact end) of the well region 11. On the other hand, in the fifth embodiment, the distance between each unit cell 4 and the contact 20 is shortened, so that the potential drop and delay due to the well resistance can be suppressed. In addition, the cell area is minimized in the configuration in which the well regions 11 are separated on the basis of each unit cell 4.

Figure 16:
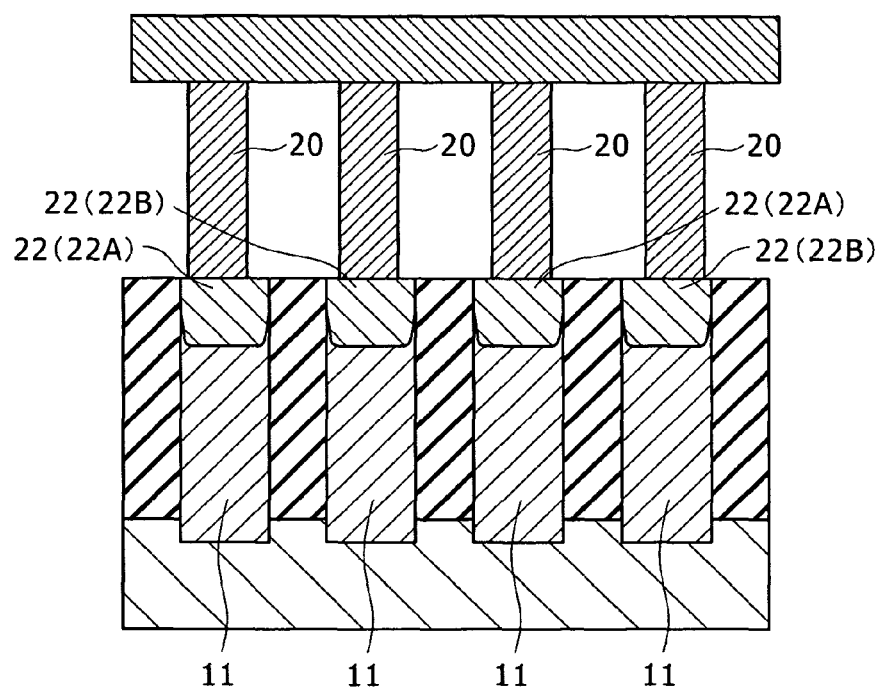
FIG. 16 is a sectional view of a lead-out diffusion layer of a contact part, taken along the laying direction of a well wiring.
Figure 18A:
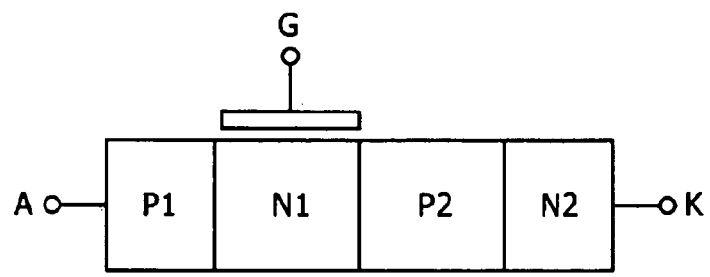
FIGS. 18A to 18C are a configuration diagram and operation illustrations, of a semiconductor device with a thyristor configuration according to the related art.
Figure 18B:
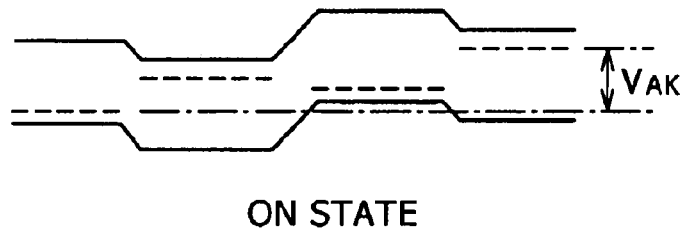
Figure 18C:
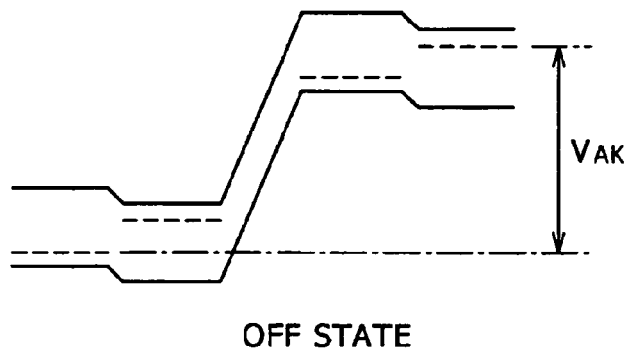
Figure 20:
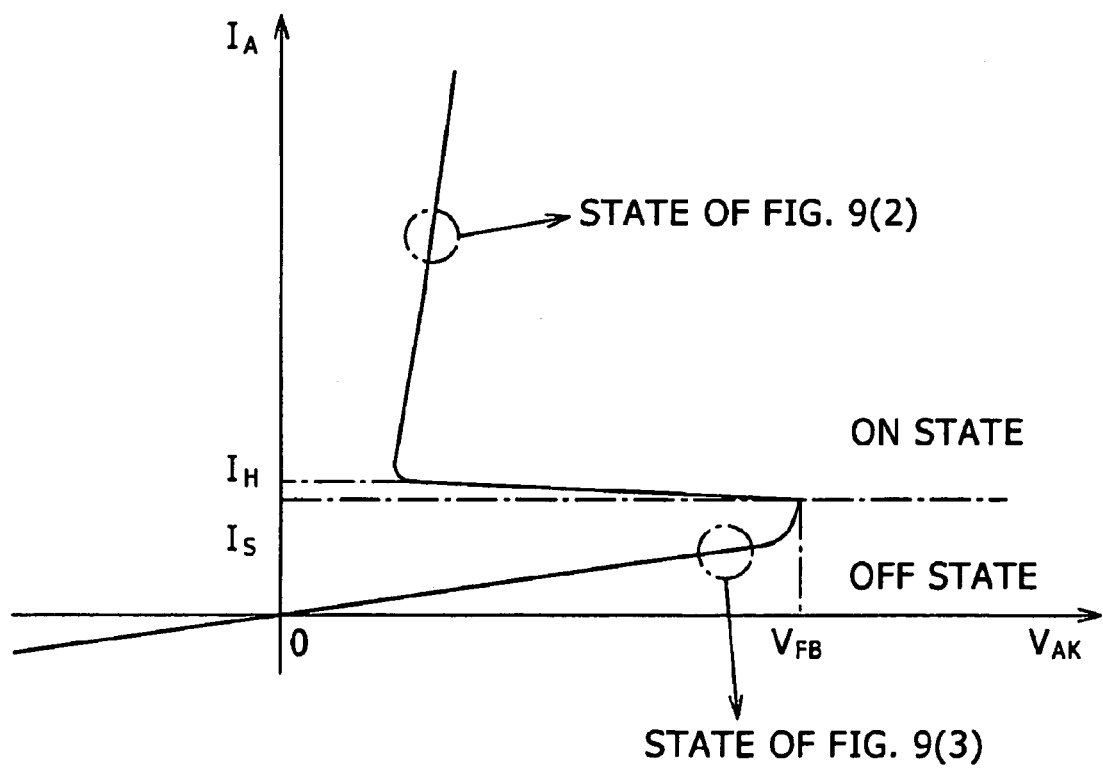
FIG. 20 is a voltage-current characteristic diagram showing the voltage-current (V-I) characteristic of the semiconductor device with the thyristor configuration according to the related art.

Besides, in each of the above-described embodiments, the well region 11 is of n-type, so that the contact 20 for the well region 11 is usually formed, with an n+ type diffusion layer therebetween. However, in the case where the contact 20 is formed through the n+ type diffusion layer, interference may occur between the cells through the contacts 20. In addition, in the configuration in the embodiments of the present invention, it is desirable that the contact and the wiring are used in common for a plurality of unit cells as much as possible, in order to prevent an increase in the cell size. In view of these points, as shown in FIG. 16 which is a sectional view of a contact part taken along the laying direction of the well wiring, the lead-out diffusion layers 22 (22A, 22B) in the regions, where the contacts 20 are connected, of the well regions 11 are each composed of a diffusion layer of the first conduction type (p+ type). Where the contacts 20 are connected through the lead-out diffusion layers 22 of the first conduction type (p+ type), the currents flowing between the cells through the contacts 20 can be suppressed, whereby it is made difficult for the interference between the cells to occur.

Now, a modified example of the first embodiment will be described below, referring to a schematic configuration sectional view in FIG. 17.

As shown in FIG. 17, a semiconductor device 5 is the same as the semiconductor device 1 described referring to FIG. 1 above, except that the well region 11 is formed to extend to the lower side of the p-type well region 51 where the field effect transistor 3 (3A, 3B) to be a selecting transistor is formed. This will be described specifically below.

The semiconductor device 5 has a thyristor 2 including a first p-type region p1, a first n-type region n1, a second p-type region p2, and a second n-type region n2 which are junctioned in order. The impurities and impurity concentrations in the regions constituting the thyristor 2 are the same as described in the first embodiment.

Device forming regions are partitioned by device isolating regions 31 in the bulk semiconductor substrate 10, and the well regions 11 of the second conduction type (n type) are formed in the bulk semiconductor substrate 10 in which the thyristors are formed. The well region 11 can be formed to extend to the lower side of the p-type well region 51 where to form the selecting transistor 3 which will be described later. More specifically, the well region 11 can be formed over the whole area of the bulk semiconductor substrate 10. As the bulk semiconductor substrate 10, for example, a bulk silicon substrate is used.

An upper layer of the well region 11 is formed in a first conduction type (p type) region, and this region constitutes a second p-type region p2 of the thyristor. A gate electrode 13 is formed over the second p-type region p2, with a gate insulating film 12 therebetween. A hard mask (not shown) may be formed on the gate electrode 13. The gate insulating film 12 is composed, for example, of a silicon oxide ($SiO_2$) film, in a thickness of about 1 to 10 nm. For the gate insulating film 12, the materials mentioned in the first embodiment can be used.

The gate electrode 13 is usually formed of polycrystalline silicon. Or, a metal gate electrode may be adopted, or the gate electrode may be formed of silicon-germanium (SiGe) or the like. In addition, the hard mask used in forming the gate electrode 13 may be left on the gate electrode 13. The hard mask is composed, for example, a silicon oxide ($SiO_2$) film, a silicon nitride ($Si_3N_4$) film or the like.

Side walls 15 and 16 are formed on side walls of the gate electrode 13. The side walls 15 and 16 are formed of either one of silicon oxide ($SiO_2$) and silicon nitride ($Si_3N_4$) or are each composed of a laminate film of both the materials. Further, a salicide block 17 used in performing a salicide process on the anode side and the cathode side may be formed to extend ranging from the upper side of the second region n1 to the upper side of the gate electrode 13.

A first n-type region n1 of the second conduction type (n type) in junction to the second p-type region p2 is formed in the bulk semiconductor substrate 10 on one side of the gate electrode 13. A second n-type region n2 of the second conduction type (n type) in junction to the second p-type region p2 is formed in the bulk semiconductor substrate 10 on the other side of the gate electrode 13. A first p-type region p1 of the first conduction type (p type) is formed at an upper part of the first n-type region n1.

Further, an anode A (e.g., a power source voltage VDD) is connected to the first p-type region p1, whereas a cathode K is connected to the second n-type region n2. In addition, though not shown, a silicide (titanium silicide, cobalt silicide, nickel silicide or the like) may be formed over the first p-type region p1, the second n-type region n2, and the gate electrode 13.

In the semiconductor device 5, a first voltage is impressed on the first p-type region p1 side of the thyristor 2, a second voltage higher than the first voltage is impressed on the second n-type region n2 side, and a voltage higher than or equal to the first voltage is impressed on the well region 11. The voltage impressed on the well region 11 is not higher than the second voltage. For example, the well region 11 is connected to a ground GND (−1 to 1 V).

On the other hand, a first conduction type (p type) well region 51 is formed in the region of the bulk semiconductor substrate 10 where to form a field effect transistor, and the field effect transistor 3 (3A, 3B) is formed there. The field effect transistor 3 has a gate electrode 53 formed over the p-type well region 51, with a gate insulating film 52 therebetween, and has side walls 54 and 55 on both lateral sides of the gate electrode 53. In addition, extension regions 56 and 57 of source/drain regions are formed in the p-type well region 51 on the lower side of the side walls 54 and 55. Further, in the p-type well region 51 on both lateral sides of the gate electrode 53, a drain region 58 on one side and a source region 59 on the other side are formed, through the extension regions 56 and 57 respectively therebetween, and the source region 59 is connected to the second n-type region n2 (cathode side) of the thyristor 2 through a wiring 71 (cathode K). In addition, the drain region 58 is connected to a bit line BL. The source region 59 is used in common for the field effect transistors 3A and 3B. Here, the field effect transistor 3B functions as a selecting transistor of another thyristor (not shown) formed through the device isolating region 31.

In the semiconductor device 5, the same effects as those of the semiconductor device 1 described in the first embodiment above can be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   an anode connected to a first region of a first conduction type, a second region of a second conduction type being between a third region of said first conduction type and said first region;
   a cathode connected to a fourth region of said second conduction type, said third region being between said fourth region and said second region;
   a ground connected to a well region of said second conduction type, said third region being between said well region and a gate electrode,
   wherein a thyristor word line is connected to said gate electrode, said well region being in parallel to the laying direction of said thyristor word line.

2. The semiconductor device as set forth in claim 1, wherein a contact provides a connection between said well region and a well wiring.

3. The semiconductor device as set forth in claim 2, wherein said contact is disposed at an end part of said well region.

4. The semiconductor device as set forth in claim 2, wherein said contact is disposed along said thyristor word line.

5. A semiconductor device comprising:
   a first p-type region (p1) connected to an anode (A), a first n-type region (n1) being between a second p-type region (p2) and said first p-type region (p1);
   an n-type well region (11) connected to a ground (GND), said second p-type region (p2) being between a gate electrode (13) and said n-type well region (11);
   a second n-type region (n2) connected to a cathode (K), said second p-type region (p2) being between said first n-type region (n1) and said second n-type region (n2),
   wherein said cathode (K) is connected to a source region of a field effect transistor.

6. The semiconductor device as set forth in claim 5, wherein said second p-type region (p2) is within said n-type well region (11).

7. The semiconductor device as set forth in claim 5, wherein a portion of said second p-type region (p2) is between said n-type well region (11) and said second n-type region (n2).

8. The semiconductor device as set forth in claim 5, wherein another portion of said second p-type region (p2) is between said n-type well region (11) and said gate electrode (13).

9. The semiconductor device as set forth in claim 5, wherein a different portion of said second p-type region (p2) is between said n-type well region (11) and said first n-type region (n1).

10. The semiconductor device as set forth in claim 5, wherein said n-type well region (11) is within a bulk semiconductor substrate (10).

11. The semiconductor device as set forth in claim 5, wherein a first voltage is impressed on said first p-type region (p1), a voltage higher than or equal to said first voltage being impressed on said n-type well region (11).

12. The semiconductor device as set forth in claim 11, wherein a second voltage higher than said first voltage is impressed on said second n-type region (n2).

13. The semiconductor device as set forth in claim 12, wherein said voltage impressed on said n-type well region (11) is not higher than said second voltage.

14. The semiconductor device as set forth in claim 5, wherein a thyristor word line (18) is connected to said gate electrode (13), said n-type well region (11) being in parallel to the laying direction of said thyristor word line (18).

15. The semiconductor device as set forth in claim 14, wherein a contact (20) provides a connection between said n-type well region (11) and a well wiring (19).

16. The semiconductor device as set forth in claim 15, wherein said contact (20) is disposed at an end part of said n-type well region (11).

17. The semiconductor device as set forth in claim 15, wherein said contact (20) is disposed along said thyristor word line (18).

* * * * *